United States Patent
Kinoshita

(10) Patent No.: US 6,330,265 B1
(45) Date of Patent: Dec. 11, 2001

(54) OPTICAL FUNCTIONAL ELEMENT AND TRANSMISSION DEVICE

(75) Inventor: Junichi Kinoshita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/295,295

(22) Filed: Apr. 20, 1999

(30) Foreign Application Priority Data

| Apr. 21, 1998 | (JP) | 10-110529 |
| Apr. 24, 1998 | (JP) | 10-114889 |
| Nov. 5, 1998 | (JP) | 10-314842 |

(51) Int. Cl.[7] .................. H01S 5/00; H01S 3/08
(52) U.S. Cl. .................. 372/50; 372/96
(58) Field of Search ............. 372/45, 46, 96, 372/50; 257/13, 21

(56) References Cited

U.S. PATENT DOCUMENTS

| 5,111,467 | * | 5/1992 | Bradley | 372/50 |
| 5,384,797 | * | 1/1995 | Welch et al. | 372/50 |
| 5,818,066 | * | 10/1998 | Duboz | 257/21 |
| 6,031,243 | * | 2/2000 | Taylor | 372/50 |

OTHER PUBLICATIONS

Hardy, et al., "Analysis of Second–Order Gratings," IEEE Journal of Quantum Electronics, vol. 25, No. 10, Oct. 1989, pp. 2096–2105.

Streifer, et al., "Analysis of Grating–Coupled Radiation in GaAs:GaAlAs Lasers and Waveguides—II: Blazing Effects," IEEE Journal of Quantum Electronics, vol. QE–12, No. 8, Aug. 1976, pp. 494–499.

* cited by examiner

*Primary Examiner*—Quyen Leung
(74) *Attorney, Agent, or Firm*—Hogan & Hartson, L.L.P.

(57) ABSTRACT

A distributed feedback laser comprising: waveguide (4) having a hologram (10) capable of emitting radiation mode light in upper and lower directions; first reflector (20) provided below said waveguide for returning said radiation mode light back to said waveguide; and second reflector (21A, 21B, 21C, 21D, 21E) provided above said waveguide for returning said radiation mode light back to said waveguide, intensity profile of said radiation mode light on said waveguide being non-uniform is disclosed. Also, by using 2nd- or higher-order diffraction gratings having an asymmetric cross-sectional configuration together with a reflection structure located at one side thereof, a highly directional optical isolator can be provided. Further, the present invention provides an optical functional element comprising: first waveguide which guides optical waves and has a grain or a loss, said waveguide having a hologram (202) capable of coupling with said optical waves guided by said waveguide to generate radiation mode light; amplifier (203) for amplifying said radiation mode light released from said first waveguide and releasing it; and first reflector (204) for reflecting said radiation mode light emitted from said amplifier back to said first waveguide.

3 Claims, 25 Drawing Sheets

OPTICAL FUNCTIONAL ELEMENT AND TRANSMISSION DEVICE

BACKGROUND OF THE INVENTION

This invention relates to various kinds of novel optical functional elements and optical transmission and receiving devices based on waveguide means having holograms which generate radiation modes.

More specifically, the invention relates to a distributed feedback (DFB) laser emitting radiation-mode light normal to the substrate surface and its manufacturing method.

The invention also relates to a waveguide type optical isolator, distributed feedback laser being compact, high in directional selectivity and good in optical coupling, and a monolithically integrated optical element containing them.

The invention further relates to optical functional elements such as optical amplifier, optical modulator, laser oscillator, and so forth, having a resonator means, for high-efficiency amplification of radiation modes emitted from the waveguide means, and optical transmission and receiving devices using them.

Optical functional elements having a waveguide for guiding light waves involve semiconductor lasers. Conventional semiconductor lasers utilize a single waveguide structure as a resonator. A semiconductor optical amplifier (SOA) similarly has a single waveguide structure. A grating-coupled surface-emitting laser (GCSEL) also utilizes a single waveguide structure sometimes with a single vertical reflector placed on the substrate side for recycling the radiation mode emitted towards substrate by changing its direction toward surface. That is, any of conventional optical functional elements was based on the concept of one resonator means utilizing one-way feedback.

Since this conventional concept is a common knowledge, here is omitted detail explanation on structures of conventional optical functional element with reference to drawings. A drawback of these conventional techniques lies in the lack of extensibility and flexibility because of using only one resonator means.

SUMMARY OF THE INVENTION

The present invention jumps far from the conventional concept. The invention employs a dual reflector mechanism with a waveguide generating a radiation mode in order to realize novel DFB lasers. More specifically, the invention disclosed herein provides a DFB laser comprising waveguide means having a hologram (10) capable of emitting radiation mode light in upper and lower directions; first reflection means (2) provided below said waveguide means for returning said radiation mode light back to said waveguide means; and second reflection means (21A, 21B, 21C, 21D, 21E) provided above said waveguide means for returning said radiation mode light back to said waveguide means, and means controlling the intensity profile of said radiation mode light along said waveguide means being.

The present invention also employs a holograms asymmetrical with respect to the light traveling direction, with reflector and/or optical amplifier in order to realize a novel optical isolator. More specifically, the present invention provides an optical isolator comprising: waveguide means (104) having a second-order or higher-order corrugations as holographic means (110, 110', 110") whose cross-sectional configuration is asymmetric with respect to the waveguide direction, selectively affecting each of radiation modes emitted towards the opposite (upper and lower) directions of said waveguide means, provided with different reflection means on the opposite sides of said waveguide means (104).

The present invention also employs a further advanced concept that another resonator structure is made in a different direction along the conventional resonator structure or a waveguide structure in order to realize various kinds of novel optical functional elements. More specifically, the present invention provides an optical functional element comprising: first waveguide means which guides light waves and has a gain or a loss, said waveguide means having a hologram (202) capable of coupling with said light waves guided by said waveguide means to generate radiation mode light; amplifier means (203) for amplifying said radiation mode light released from said first waveguide means and releasing it; and first reflection means (204) for reflecting said radiation mode light emitted from said amplifier means back to said first waveguide means.

The above-mentioned every aspect of the invention is based on the concept of making a resonator structure of a radiation mode radiated from a waveguide having a hologram. In the present specification, the term "hologram" is defined as a "periodic structure of a complex index of refraction or complex index of reflection (the part of imaginary numbers indicates a loss/gain) capable of generating a spatially controlled radiation mode". "2nd- or higher-order diffraction gratings" employed in embodiments described below are not but some modes of "holograms" because a diffraction grating (corrugation) is a structure based on a periodic structure with a simplest refractive index in which, mainly, the part of real numbers is uniform. Thus being easy to understand, examples using diffraction gratings are taken to progress explanation.

On the other hand, as explained later in greater detail, delicately changing the period of diffraction gratings in the waveguide direction and making a phase shift, as well, are important embodiments of the invention. To collectively categorizing these modifications, the "hologram" is as defined above.

A feature of the invention is to provide a high-reflectivity structure on the side opposite from a substrate in addition to that conventionally provided only on the side nearer to the substrate in a DFB laser having 2nd-order diffraction gratings. Reflecting mirrors provided above and below a waveguide can control the radiation mode by the 2nd-order diffraction gratings. Additionally, the reflectance of each reflector, including the presence or absence of reflectors, is changed in the cavity longitudinal direction or in the waveguide transverse direction.

Also in a surface-emitting DFB laser, if radiation mode light is taken out only from an area with larger radiation mode intensities and not from the entirety of the resonator, a part of the waveguide outside a light take-out window region is sandwiched by high-reflectivity structures.

With the construction shown above, since the high-reflectivity structure is provided also above the waveguide, the radiation mode caused by the 2nd-order diffraction gratings does not go out externally. Therefore, the loss of the radiation mode can be reduced, and an increase in threshold value can be prevented. The use of the 2nd-order diffraction gratings also facilitates its fabrication.

The phase shift provided in the 2nd-order diffraction gratings enables control of spatial distribution of light and carriers. That is, if the reflection at both facets of the laser is small and coupling of diffraction gratings and the guided mode is large to a certain extent, an intensity profile making both the guided mode and radiation mode more intensive by the central phase shift is obtained, and by making a gain/loss profile along the optical axis direction of the cavity in this manner, unevenness of the carrier density can be compensated to prevent spatial holeburning Moreover, the invention increases the flexibility of controlling the intensity of the guided mode in the axial or transverse direction by making an appropriate gain/loss spatial profile without changing the structure of the active layer itself or changing the electrode structure. As a result, asymmetry of edge outputs and a new gain-guided structure can be provided.

When an output window and a high-reflectivity structure are provided above the waveguide, the radiation mode returns to the waveguide. Therefore, the radiation loss is minimized, and a surface-emission type laser is prevented from increasing in threshold value.

When a high-reflectivity structure is provided only above the front facet, the loss of the radiation mode of 2nd diffraction gratings at the front facet decreases, and the optical intensity there becomes larger than that of the rear facet with a large loss. As a result, optical output from the front facet is made larger while monitoring optical output from the rear facet is held low.

When a high-reflectivity means narrower than the width of a stripe-shaped electrode is provided above the waveguide, the effects of the return of the radiation mode by reflection from the high-reflectivity structure increases as getting nearer to the center of the stripe where the photon density increases, and it is possible to relatively compensate the decrease of the gain at the central portion of the stripe. This results in stabilizing the transverse mode.

When a high-reflectivity structure is provided above a central portion of the cavity of a surface-emission type laser, where the radiation mode is intensive, optical output decreases, but the oscillation threshold value can be lowered by reducing the radiation loss. As a result, temperature characteristics of laser oscillation as well can be improved. Simultaneously, by adjusting the distribution of light and carriers along the optical axis direction of the cavity, spatial holeburning can be prevented to stabilize the oscillation mode. That is, the invention realizes a surface-emission type laser with a low oscillation threshold value and good oscillation characteristics, although being low in optical output, and it is suitable for use in various applications in which oscillation characteristics are more important than optical output.

On the other hand, according to the invention, by using 2nd-or higher-order diffraction gratings having an asymmetric cross-sectional configuration together with a reflection structure located at one side thereof, a highly directional optical isolator can be provided. That is, in waveguide structures having 2nd-or higher-order diffraction gratings, in general, guided light disperses as a radiation mode. However, if it is reflected back to the waveguide, the loss by dispersion decreases. When blaze diffraction gratings, i.e. diffraction gratings having an asymmetric cross-sectional configuration, are used, the radiation mode becomes extremely intensive in one of traveling directions of guided light.

Therefore, the loss is decreased by a reflection structure provided in the direction. In the opposite side, even if the radiation mode is left to disperse without no reflection structure, the loss is small because the radiation mode is small originally.

When guided light travels in the opposite direction, the radiation mode increases at the dispersion side without the reflection structure, and it results in decreasing the radiation mode on the part of the reflection structure. Therefore, the loss relative to the oppositely travelling waves becomes large. In this manner, an optical isolator varying in loss depending upon the travelling direction of guided light can be realized.

The optical isolator of this type can be made as an extension of diffraction gratings of a DFB laser, and it is advantageous in easy monolithic integration with a DFB laser or external modulator.

The invention also makes it possible to construct a semiconductor waveguide type optical isolator by appropriately designing the diffraction gratings, without modifying the basis structure of the waveguide, to provide high-reflectivity and anti-reflection structure outside the waveguide structure. that is, by making 2nd- or higher-order asymmetric diffraction gratings, reflection structure and absorption structure at opposite sides of the diffraction gratings, a very compact, high-efficiency optical isolator can be realized. Therefore, the optical isolator does not largely deform NFP (near field pattern) of a waveguide and FFP (far field pattern) of emitted beams, and optically couples to optical fibers and various optical elements with a high efficiency.

The invention also makes it easy to increase the dynamic range of the wavelength by changing the period of the diffraction gratings to thereby realize an optical isolator which acts on various waveforms.

When a phase shift is provided in the diffraction gratings, distribution of guided light or emitted light can be controlled to optimize the optical directivity and emission characteristics. The invention can also realize a DFB laser strong or return light, high in efficiency of the output side and stable in longitudinal mode.

Furthermore, the invention remarkably facilitates monolithic integration of an optical isolator with a DFB laser or waveguide type modulator. That is, diffraction gratings, reflection structure and anti-reflection structure can be made as a common structure to simplify their fabrication. As a result, no independent isolator need not be made, and the cost of the optical module can be reduced largely. Additionally, since these elements share a waveguide, optical coupling among these elements is ensured.

On the other hand, by applying the radiation mode cavity structure under the new concept along various waveguide structures, novel optical devices for various functions can be realized.

Although their effect's will be explained individually with respective embodiments, their general effects are as set forth below. That is, according to the invention, since components like the amplifier means or reflection means are aligned along the waveguide, their efficient interactions with the wave guide are promised.

Efficient optical excitation is one of these examples. Additionally, positioning along the waveguide ensures an efficient arrangement not requiring a large area. This is also suitable for monolithic integration. Furthermore, since the diffraction gratings themselves have a waveguide selectively and a function as a diffraction grating coupler, functions of a divider or a multiplexer are realized, and a compact, low-cost optical functional element can be realized when it is used as a wavelength multiplexing optical device.

When the low-cost, high-performance optical active device is used, a high-performance optical transmission device can be provided inexpensively.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIGS. 24A and 24B are conceptional diagrams showing cross-sectional structures of an element employing quarts cladding, in which FIG. 24A is a cross-sectional view taken along the longitudinal center axis of its waveguide whilst FIG. 24B is a cross-sectional view taken along a transversal plane vertical of the waveguide;

FIGS. 25A and 25B are conceptional diagrams showing cross-sectional structures of an element with its waveguide being activated by reverse biasing, in which FIG. 25A is a cross-sectional view taken along the longitudinal center axis of the waveguide whilst FIG. 25B is a cross-sectional view taken along a transversal plane vertical of the waveguide;

FIGS. 26A and 26B are conceptional diagrams showing cross-sectional structures of an optical functional element integrating a laser and an optical modulator, in which FIG. 26A is a cross-sectional view taken along the longitudinal center axis of its waveguide whilst FIG. 26B is a cross-sectional view taken along a transversal plane vertical of the waveguide;

DETAILED DESCRIPTION OF THE PREFERRED EMBODIMENTS

Embodiments of the invention are described below in detail with reference to the drawings.

First explained are a distributed feedback laser (DFB laser) and its manufacturing method according to the invention. The DFB laser is characterized in having reflectors on and under its waveguide, respectively.

Figure 1:
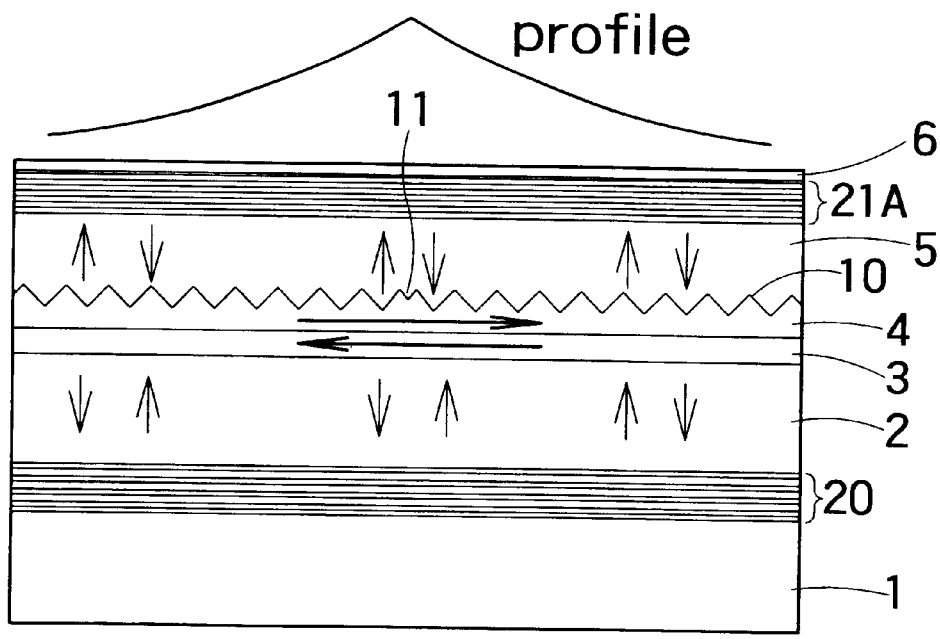
FIG. 1 is a cross-sectional, conceptional diagram schematically showing construction of a central part of a DFB laser according to the first embodiment of the invention.

FIG. 1 is a cross-sectional conceptional diagram schematically showing construction of a central part of a DFB laser according to the first embodiment of the invention. The laser shown here is a InGaAsP/InP edge-emitting DFB laser having 2nd-order diffraction gratings 10, and FIG. 1 shows it in a cross-sectional conceptional diagram taken along a plane parallel to the waveguide direction of its cavity.

In the DFB laser shown here, a high-reflectivity structure 20 made up of InGaAsP layers and InP layers are made on an n-type InP substrate 12. Further formed thereon are an n-type InP buffer layer 2 with the thickness of 1 micrometers strained MQW active layer 3 made of InGaAsP (PL (photoluminescence) wavelength: 1.3 micrometers), and InGaAsP waveguide layer 4 (PL wavelength: 1.12 micrometers) continuously by crystal growth. Formed on the waveguide layer 4 are 2nd-order diffraction gratings 10. The diffraction gratings 10 have formed a discontinuous portion 11 (phase shift) with the period of λ (wavelength)/4.

Further grown thereon are a p-type InP cladding layer 5, high-reflectivity structure 21 and p-type InGaAsP contact layer 6 (PL wavelength: 1.15 micrometers). The high-reflectivity structure 21, similarly to the high-reflectivity structure 20, may be made by alternately stacking InGaAsP layer and InP layers to form a multi-layered Bragg reflector. On the upper and lower surfaces of the element, electrodes, not shown, are made, respectively.

The DFB laser according to the invention as shown in FIG. 1 as explained, comparing it with a DFB laser as a comparative example obtained during researches toward the present invention.

DFB lasers, in general, are characterized in providing diffraction gratings along the waveguide and utilizing Bragg diffraction light from the diffraction gratings for optical feedback to invite laser oscillation. Since a vertical mode is selected among various modes of radiation, DFB lasers are advantageous in that oscillation in a single longitudinal mode is possible. Because of this advantage, DFB lasers are currently used as light sources of high-speed optical transmission or measurement using optical fibers.

Diffraction gratings used in DFB lasers involve 1st-order gratings and 2nd-order gratings. First-order gratings have a 1st -order period corresponding to a radiation wavelength. 2nd order gratings have a period twice that of a 1st-order gratings, and are readily made. For example, in an InGaAsP/InP DFB laser with a wavelength in the band of 1.3 micrometers, the period of the 1st-order gratings is approximately 0.2 micrometer. Processing accuracy required for making them is almost 0.1 micrometer, control of their depth is also difficult. In contrast, the period of 2nd-order gratings is 0.4 micrometer, and it is much easier to make them.

DFB lasers having 2nd-order gratings, however, emit radiation mode light in both opposite directions vertical to the waveguide, namely, to the substrate side and the superstrate side. In DFB lasers having 1st-order gratings, there is no such radiation mode. That is, when 2nd-order gratings are used, the radiation mode becomes a loss, and causes an increase of the threshold value. Therefore, in spite of the difficulty of their fabrication, 1st-order diffraction gratings were usually employed to ensure appropriate characteristics such as threshold value.

GCSEL (grating-coupled surface emitting laser) is an example positively using 2nd-order gratings. This is a surface emitting laser which uses as its output radiation mode light emitted vertically to the substrate. It does not require facets made by cleavage, and can be tested as wafer in the manufacturing process of the device.

Therefore, it is advantageous from the viewpoint of productivity. In GCSEL, radiation mode light emitted to the superstrate side is used as its optical output. To increase the efficiency of its output, radiation mode light to the substrate side must be returned to the waveguide to use it effectively. In this connection, it has been proposed to make a high-reflectivity thin-film structure on the substrate side to adjust the phase reflected thereby (for example, A. Hardy, D. F. Welch, and W. Streifer, "Analysis of Second-Order Gratings", IEEE Journal of Quantum Electronics, vol. 25, pp. 2096–2105, 1989).

Figure 6:
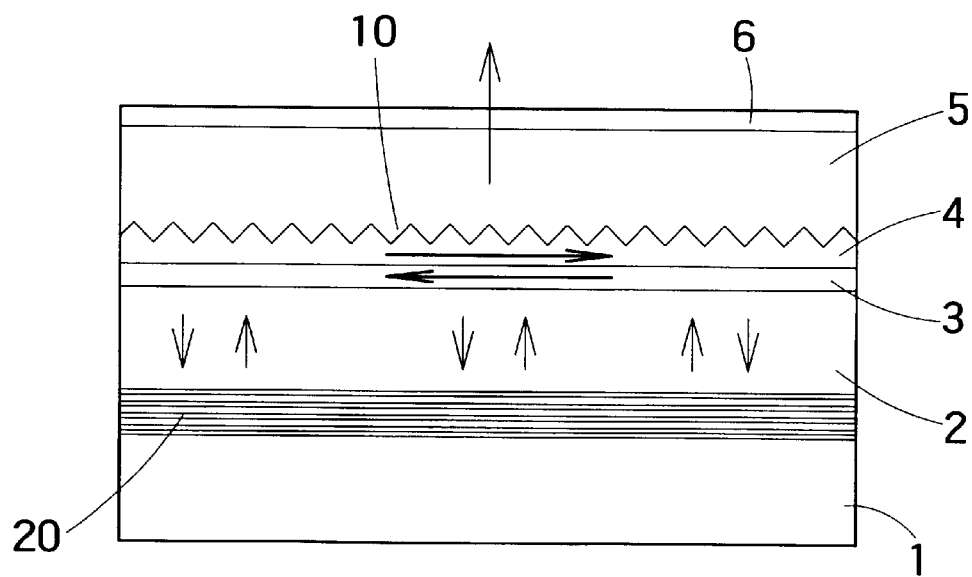
FIG. 6 is a schematic diagram showing a cross-sectional structure of a DFB laser element taken as a comparative example.

FIG. 6 schematically shows a cross-sectional configuration of a DFB laser element as such a comparative example. That is, FIG. 6 shows a comparative example of InGaAsP/InP surface emitting laser. In the laser shown here, a high-reflectivity multi-layered structure 20 made up of InGaAsP layers and InP layers is made on an n-type InP substrate 1, and further formed thereon are n-type InP buffer layer 2 with the thickness of 1 micrometer, strained MQW active layer 3 made of InGaAsP (PL (photoluminescence) wavelength: 1.3 micrometers), and INGaAsP waveguide layer 4 (PL wavelength: 1.12 micrometers) continuously by crystal growth. Formed on the waveguide layer 4 are 2nd-order diffraction gratings 10. Further grown thereon are a p-type InP cladding layer 5 and a p-type InGaAsP contact layer 6 (PL wavelength: 1.15 micrometers). On the upper and lower surfaces of the multi-layered structure, electrodes, not shown, are made, respectively.

In the DFB laser using 2nd-order gratings as shown in FIG. 6, radiation mode light is radiated vertically to the substrate. If the radiation mode light is taken out vertically to the substrate surface, then the laser is a surface-emitting laser. The radiation mode light is emitted in both the upper and lower directions vertical to the substrate. By providing a reflector 20 having an appropriate phase on the substrate side, optical output oriented oppositely from the substrate can be increased.

However, in the comparative DFB laser shown in FIG. 6, the radiation mode emitted on the superstrate side from 2nd-order gratings made an emission loss, and the threshold value of laser oscillation was liable to rise.

Moreover, in conventional DFB lasers, it was difficult to control the intensity profile of a radiation mode derived from 2nd-order gratings. Therefore, part of the radiation mode toward the substrate is reflected by the reflector 20, and returns to the active layer 3 via the diffraction gratings 10. However, depending upon the relation between the location of the reflector and the phase of the radiation mode, the radiation mode output running upward becomes sometimes weak and sometimes intensive, and its control was difficult. Therefore, it was difficult to establish a stable radiation mode.

Furthermore, in a part of cavity where the intensity of the guided mode is large, the phenomenon that the carrier density decreases and makes the guided mode and the vertical mode unstable (spatial holeburning) may occur. In conventional DFB lasers, however, it was difficult to prevent spatial holeburning because of the difficulty in controlling the axial carrier distribution.

In contrast, the DFB laser according to the invention as shown in FIG. 1 not only prevents a rise of the threshold value by the loss of the radiation mode but also prevents spatial holeburning.

That is, according to the embodiment shown in FIG. 1, since the high-reflectivity structure 21A is provided also above the waveguide, the radiation mode derived from 2nd-order gratings does not go out externally. Therefore, the radiation mode loss can be reduced, and a rise of the threshold value can be prevented. The embodiment, using 2nd-order gratings, also has the advantage that its fabrication is easy.

Furthermore, according to the embodiment, the use of the phase shift 11 enables appropriate control of spatial distribution of light and carriers. In the illustrated example, if reflection from both edges of the laser is small and coupling force between the gratings and the guided mode is somewhat large, then an intensity profile in which both the guided mode and the radiation mode get intensive at the phase shift 11 at the center. This intensity distribution profile is schematically shown in FIG. 1. By making the gain/loss profile along the optical axis of the cavity in this manner, unevenness of the carrier density an be compensated so as to prevent spatial holeburning.

Additionally, the freedom of controlling the guided mode intensity in the axial or transverse direction is increased without changing the structure of the active layer itself or changing the electrode structure. Therefore, asymmetry of edge outputs and a novel gain-guided structure can be realized.

Through an experiment by the Inventor, the threshold value of approximately 9 mA was obtained in a DFB laser having a buried-hetero-structure, 1 micrometers wide, according to the structure shown in FIG. 1. Since the threshold value was approximately 8 mA also in a comparative example using 1st-order gratings, it was confirmed that an element exhibiting practically favorable threshold characteristics even with second-order gratings be obtained. Additionally, the laser using second-order gratings could be fabricated much easier.

Next explained is the second embodiment of the invention.

Figure 2A:
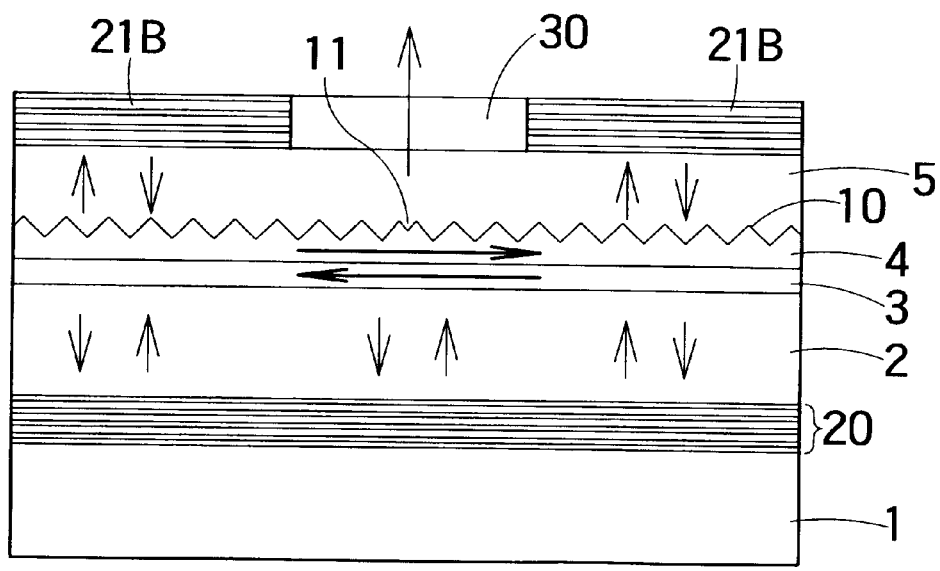
FIG. 2A is a cross-sectional, conceptional diagram schematically showing construction of a central part of GCSEL using 2nd -order diffraction gratings, taken along the longitudinal direction of its waveguide.

FIG. 2A is a cross-sectional conceptional diagram taken along the waveguide direction to schematically show construction of a central part of GCSEL using second-order gratings. This GSCEL shown here is generally the same in construction as the semiconductor laser explained with reference to FIG. 1. So, identical portions are labeled with common reference numerals, and detailed explanation thereof is omitted. One of important features of GCSEL of FIG. 2A lies in an output window 30 being opened to extract as its output the radiation mode light from a central region of approximately 50 micrometers with a large radiation mode intensity in the optical axis direction of a cavity which is approximately 250 micrometers long. That is, in the portion, no high-reflectivity structure is provided, a material transparent to the radiation mode light is used. In surface emitting lasers of this type, radiation modes in the portion except the output window 30 may become useless without contributing to outputs. In contrast, in the embodiment shown here, a high-reflectivity structure 21b is provided also on the superstrate side in the region except the output window 30. The high-reflectivity structure 21B and the substrate-side high-reflectivity structure 20 make the radiation mode to the waveguide. Therefore, the radiation loss is minimized, and increase of the threshold value can be prevented.

Also in the embodiment shown here, the phase shift 11 provided near the center of the cavity controls spatial distribution of light and carriers. In the illustrated example, if reflection from both edges of the laser is small and coupling force between the gratings and the guided mode is somewhat large, then an intensity profile in which both the guided mode and he radiation mode get intensive at the phase shift 11 at the center. By making the gain/loss profile along the optical axis of the cavity in this manner, radiation from the output window 30 can be increased, and simultaneously, non-uniformity of the carrier density can be compensated so as to prevent spatial holeburning.

Figure 2B:
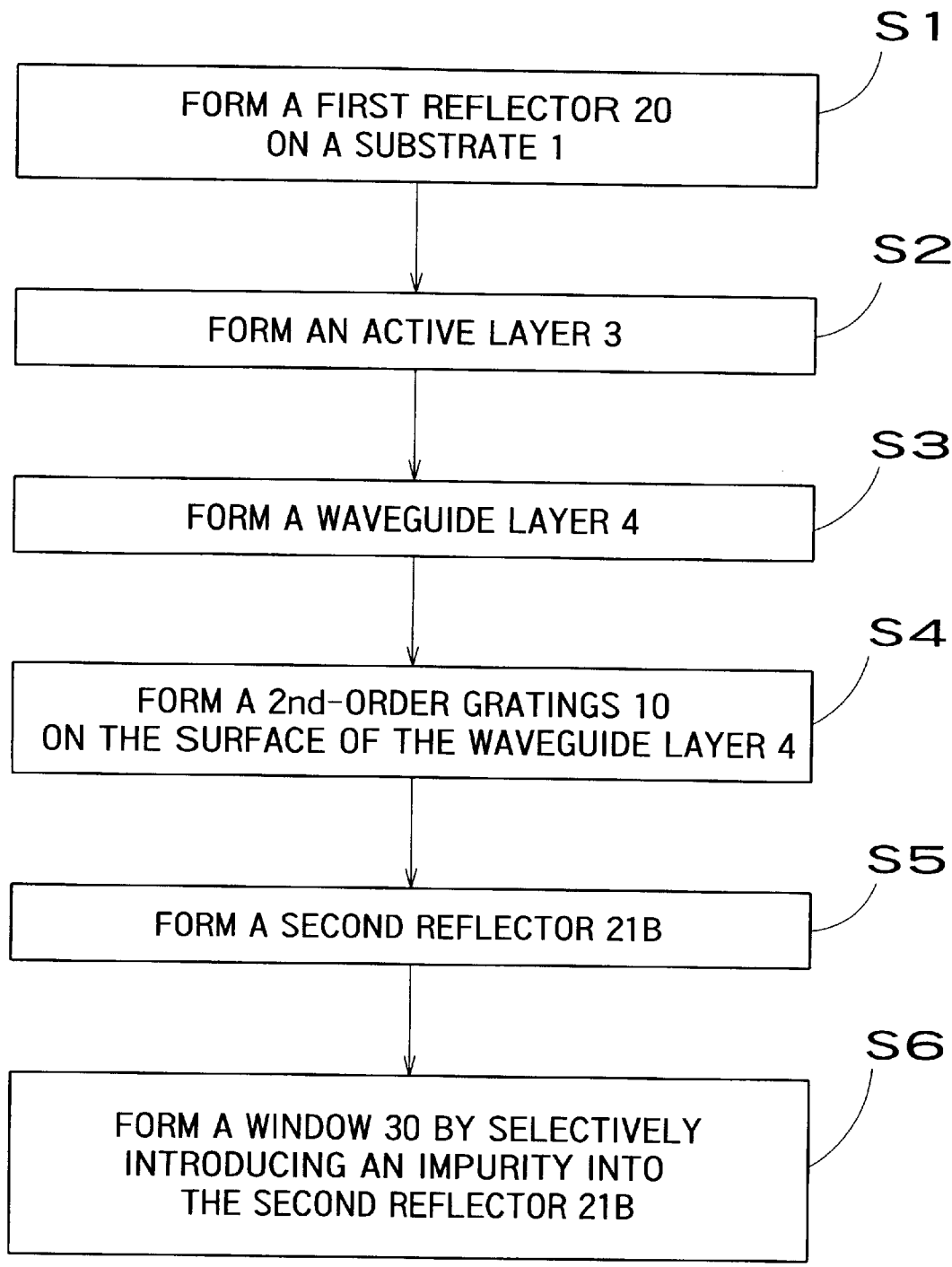
FIG. 2B shows a flowchart showing a fabrication process of the GCSEL of FIG. 2A.

FIG. 2B shows a flowchart showing a fabrication process of the GCSEL of FIG. 2A. The laser according to the embodiment can be made by a relatively easy process.

First, a high-reflectivity structure 20 made up of InGaAsP layers and InP layers is made on an n-type InP substrate 1. Further formed thereon are an n-type InP buffer layer 2 with the thickness of 1 micrometer, strained MQW active layer 3 made of InGaAsP (PL (photoluminescence) wavelength: 1.3 micrometers), and InGaAsP waveguide layer 4 (PL wavelength: 1.12 micrometers) continuously by crystal growth. Formed on the waveguide layer 4 are 2nd-order diffraction gratings 10. The diffraction gratings 10 have formed a discontinuous portion 11 (phase shift) with the period of $\lambda$(wavelength)/4.

Further grown thereon are a p-type InP cladding layer 5, high-reflectivity structure 21B. The high-reflectivity structure 21B, similarly to the high-reflectivity structure 20, may be made by alternately stacking InGaAsP layer and InP layers to form a multi-layered Bragg reflector.

In order to form the window 30, zinc (Zn) is diffused selectively into the high-reflectivity structure 21B and annealed. The Zn-incorporated region is disordered and broken into a region of a uniform intermediate composition. That is, by diffusing Zn into the region for the window of the high-reflectivity structure formed on the entirety of the element to disorder it, the window 30 with a low reflectance can be made.

Then, a p-type InGaAsP contact layer (not shown) may be formed on the reflector 21B, and electrodes (not shown) are formed on the upper and lower surfaces of the element respectively.

Next explained is the third embodiment of the invention.

Figure 3:
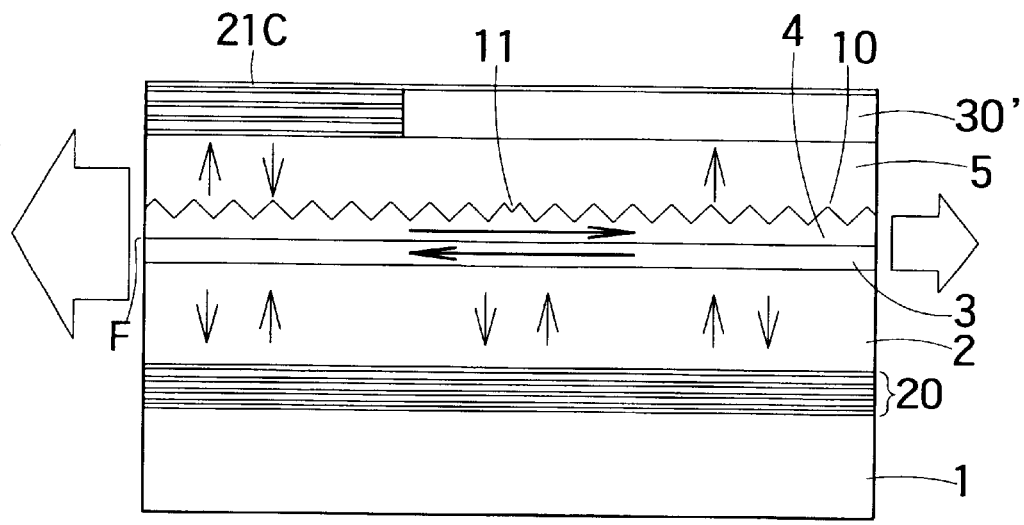
FIG. 3 is a cross-sectional conceptional diagram showing construction of a central part of an edge-emitting DFB laser using 2nd-order diffraction gratings, taken along the longitudinal direction of its waveguide.

FIG. 3 is a cross-sectional conceptional diagram taken along the waveguide direction to show construction of a central part of an edge-emitting DFB laser using second-order gratings. Here again, this laser is similar in construction to the semiconductor laser explained with reference to FIG. 1. So, identical portions are labeled with common reference numerals, and detailed explanation thereof is omitted. Also in the laser according to this embodiment, the high-reflectivity structure 20 is provided throughout the entire area under the cavity. Above the cavity, however, a high-reflectivity structure 21C is provided only adjacent to one facet F, and the remainder portion remains as a low-reflectivity region 30'. Near the center of the cavity, the phase shift 11 is provided in the gratings 10.

In the structure having the phase shift 11 in the center and alleviating reflection from both facets, optical outputs from front and rear facets are approximately equal. Practically, however, it is desirable that optical output from the front facet F be larger and optical output from the rear facet for use in monitoring be smaller.

To meet the requirement, the embodiment shown here provides the high-reflectivity structure 21C merely above the portion adjacent to the front face F. Then, since the radiation mode loss of second-order gratings decreases in the portion adjacent to the front facet F, its optical intensity becomes larger than that of the portion adjacent to the rear facet with a larger loss. As a result, large optical output from the front facet F is ensured.

Also for manufacturing the laser according to the embodiment, disordering by diffusion of zinc (Zn) can be used. That is, by making the high-reflectivity structure of a multi-layered structure over the entire surface above the cavity and next diffusing zinc only into the portion adjacent to one facet to disorder the high-reflectivity structure, the low-reflectivity region 30' can be made.

Next explained is the fourth embodiment of the invention.

Figure 4:
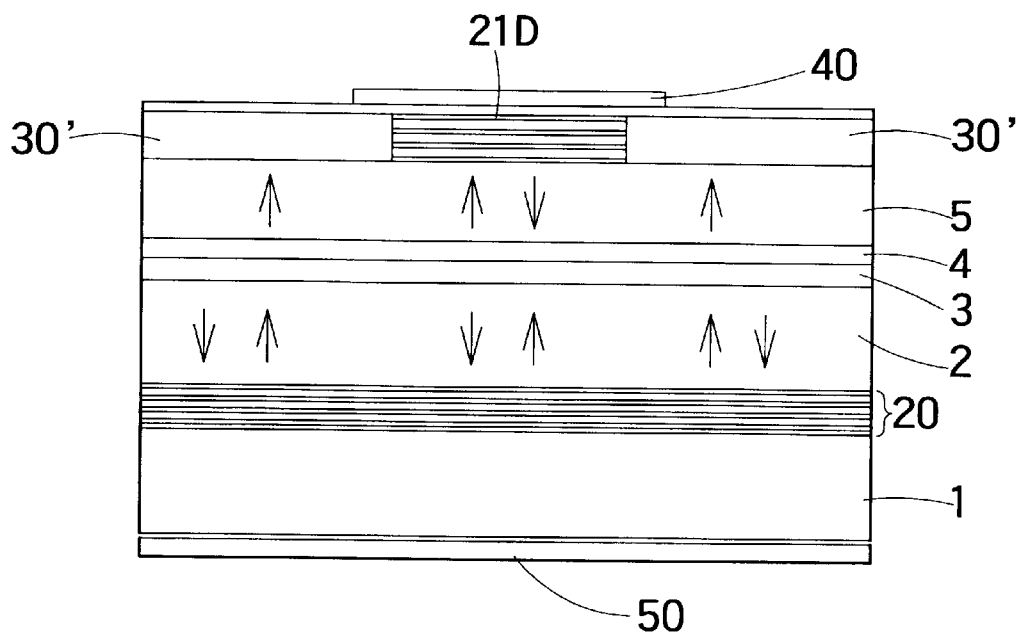
FIG. 4 is a cross-sectional conceptional diagram showing construction of a central part of an edge emitting DFB laser using 2nd-order diffraction gratings, taken along its transverse direction.

FIG. 4 is a cross-sectional conceptional diagram taken along a transverse direction to show construction of a central part of an edge emitting DFB laser using second-order gratings. That is, FIG. 4 is a cross-sectional view taken along a plane vertical to the waveguide of the cavity, which is rotated from preceding drawings by 90E and viewed from the direction of a facet.

The laser shown here has a gain-guided structure instead of an index-guided structure. The active layer 3 is a slab. In lasers of this type, in general, the active layer is excited by a current flowing from a stripe-shaped electrode 40, and light is guided accordingly. However, because of the transverse holeburning effect, the transverse mode is not stabilized. That is, as the optical intensity increases, the carrier density in the central portion of the waveguide with a high photon density becomes lower and decreases the gain, undesirable high-order transverse modes are liable to occur.

To prevent this, the embodiment shown here provides a high-reflectivity structure 21D narrower than the width of the stripe-shaped electrode 40 to lie above the electrode in alignment with the center of the stripe. At opposite sides of the stripe-shaped high-reflectivity structure 21D, the low-reflectivity region 30' lies.

In this manner, the effect by the return of the radiation mode by reflection from the high-reflectivity structure 21D progressively increases towards the center of the stripe where the photon density is high, and the decrease in gain in along the center of the stripe can be compensated relatively. As a result, the transverse mode can be stabilized.

Also for manufacturing the laser according to the embodiment, disordering by diffusion of zinc (Zn) can be used. That is, by making the high-reflectivity structure of a multi-layered structure over the entire surface above the cavity and next diffusing zinc into opposite sides of the stripe to disorder the high-reflectivity structure, the low-reflectivity region 30' can be made.

Next explained in the fifth embodiment of the invention.

Figure 5:
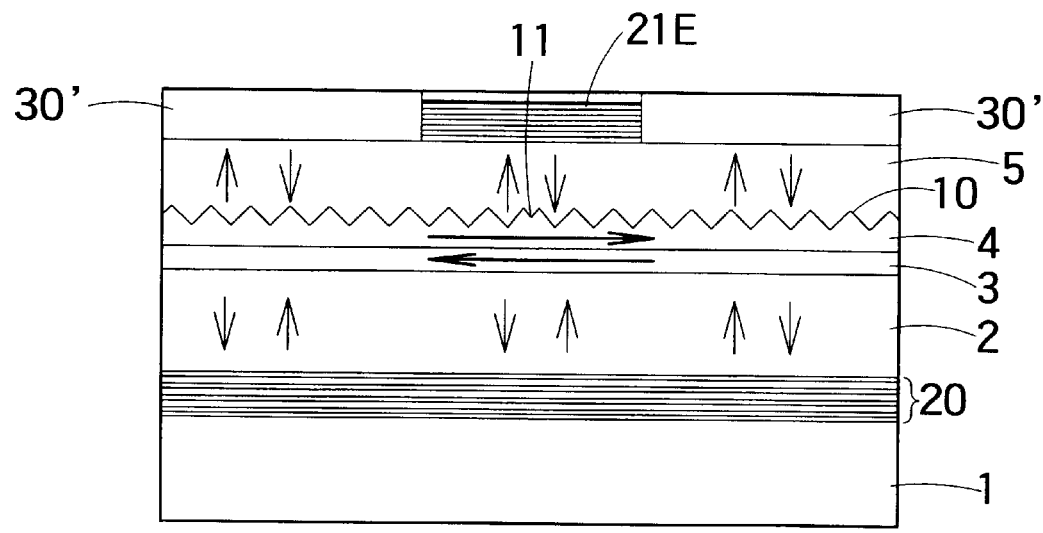
FIG. 5 is a cross-sectional, conceptional diagram schematically showing construction of a central part of GCSEL using 2nd-order diffraction gratings, taken along the longitudinal direction of its waveguide.

FIG. 5 is a cross-sectional conceptional diagram taken along the waveguide direction to schematically show construction of a central part of GCSEL using second-order gratings. Here again, GCSEL shown here is similar in construction to the semiconductor laser explained with reference to FIG. 1. So, identical portions are labeled with common reference numerals, and detailed explanation thereof is omitted. One of important features of GCSEL of FIG. 5 lies in a high-reflectivity structure 21E being provided above a central part of the cavity where the radiation mode is intensive. That is, the laser according to the instant embodiment is configured to extract as its optical output the radiation mode light passing through the high-reflectivity structure 21E. In the case where the high-reflectivity structure 21E is provided in a central part of the cavity where the radiation mode is intensive, its optical output decreases, but the oscillation threshold value can be lowered by reducing the radiation loss. As a result, temperature characteristics of laser oscillation can be improved. Simultaneously, by adjusting distribution of light and carriers along the optical axis of the cavity, spatial holeburning can be prevented to thereby stabilize the oscillation mode.

That is, according to the embodiment shown here, although the optical output is relatively low, a surface emitting laser with a low oscillation threshold value and good oscillation characteristics can be realized. So, it is suitable for use in various applications in which the oscillation property is more important than optical output.

Also for manufacturing the laser according to the embodiment, disordering by diffusion of zinc (Zn) can be used. That is, by making the high-reflectivity structure of a multi-layered structure over the entire surface above the cavity and next diffusion zinc into opposite sides excluding the central part of the cavity to disorder the high-reflectivity structure, the low-reflectivity region 30' can be made.

Some DFB lasers embodying the invention have been explained above with reference to FIGS. 1 through 6. The invention, however, is not limited to these specific examples, but is applicable to various other devices within the concept of the invention. For example, the invention is similarly applicable also to other DFB lasers using various materials, such as GaAlAs/GaAs lasers are GaInAlP/GaAs lasers, and attains similar various effects.

The specific examples have been explained as providing the high-reflectivity structure in a selective location above the waveguide and simultaneously providing a window region. However, the invention is not limited to such configurations. For example, also when the high-reflectivity structure is provided in a selective portion below the waveguide, i.e., on one side nearer to the substrate, and the window region is provided therein, the same effects can be obtained.

Alternatively, instead of locally forming the high-reflectivity structure, the reflectance of a high-reflectivity region may be locally decreased to selectively form the high-reflectivity structure and the low-reflectivity structure.

The high-reflectivity region may be made by using metal films or in form of a multi-layered structure of dielectric thin films.

Also regarding the spatial arrangement of the high-reflectivity structure, one made up of a number of micro structures or a periodic structure may be used similarly.

Not only the DFB lasers embodying the invention but also other DFB lasers, in general, have the nature weak at return light. That is, external return light may disturb oscillation conditions of a single longitudinal mode once established. This may invite fluctuations in oscillation wavelength (called wavelength chirp) and, in the worst case, may invite instability of the longitudinal mode, such as jump, or the like.

Therefore, DFB lasers need an optical isolator.

In this connection, the Inventor also invented a novel, high-performance optical isolator.

Next explained are optical isolators suitable for use together with DFB lasers and optical integrated elements integrating them, as sixth to eleventh embodiments of the invention, with reference to FIGS. 7A through 14.

Figure 7A:
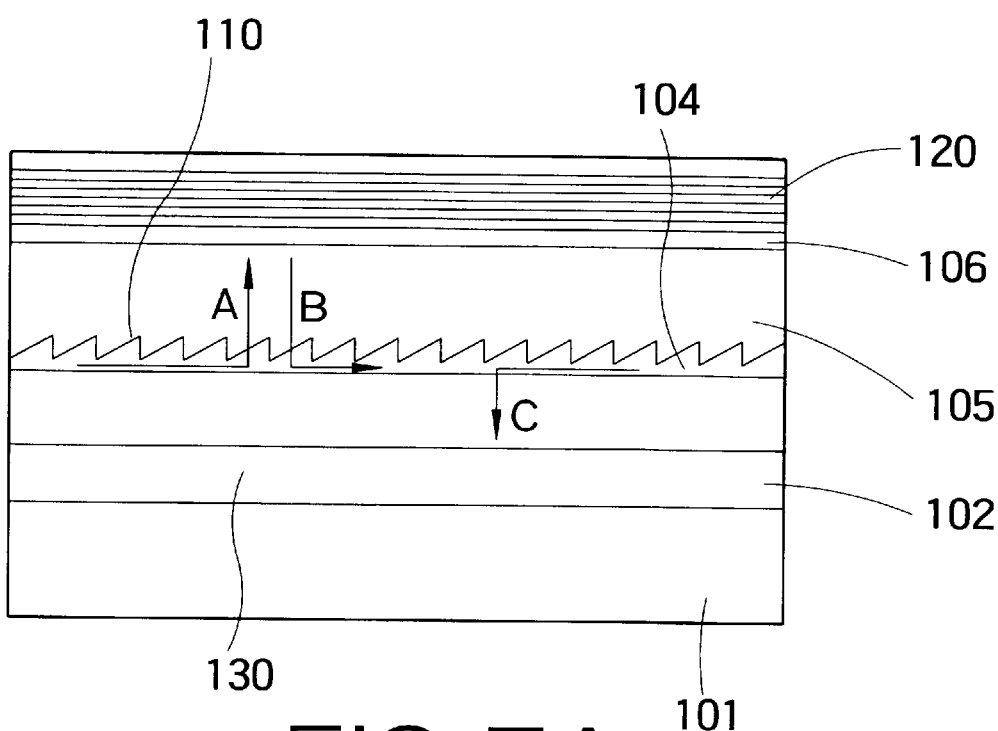
FIG. 7A is a conceptional diagram showing general construction of a first optical isolator according to the invention.

FIG. 7A is a conceptional diagram schematically showing construction of a first optical isolator according to the invention. That is, FIG. 7A illustrates a cross-sectional configuration of the optical isolator, taken along the longitudinal direction of the waveguide. The optical isolator shown here is made up of an InGaAs absorption layer 130, n-type InP cladding layer 102, InGaAsP layer 104, p-type InP cladding layer 105, p-type InGaAsP layer 106 and reflection structure 120 which are stacked sequentially on an n-type InP substrate 101.

The absorption layer 130 may be made of any material having a high absorption coefficient relative to radiation mode light. For example, it may be made by using a semiconductor material having a smaller band gap than that of the waveguide layer 104.

Formed on the surface of the waveguide layer 104 are second-order diffraction gratings 110 having a sawtoothed asymmetric cross-sectional configuration as shown in FIG. 7A. The "number of order" of the diffraction gratings is determined by the period of the diffraction gratings and the wavelength of light causing diffraction by Bragg reflection. For example, first-order gratings have a first-order period corresponding to the wavelength of the light.

Second-order gratings have a period twice that of first-order gratings. In an InGaAsP/InP optical element with a wavelength in the band of 1.3 micrometers, for example, the period of first-order gratings is approximately 0.2 micrometers. Processing accuracy required for making them is almost 0.1 micrometers, control of their depth is also difficult. In contrast, the period of 2nd-order gratings is 0.4 micrometers, and it is much easier to make them.

On the other hand, the reflection structure 120 may be a multi-layered Bragg reflective film made by alternately stacking two kinds of dielectric film different in refractive index. By appropriately determining refractive indices and thickness of individual layers in the multi-layered Bragg reflective film, a reflection structure exhibiting a high reflectance to radiation mode light can be obtained.

A manufacturing process of the optical isolator shown in FIG. 7A is outlined below. First grown on the n-type InP substrate 101 is the InGaAs absorption layer 130 for radiation mode light up to the thickness of 2.5 micrometers. After that, the n-type InP cladding layer 2 is grown to the thickness of approximately 1 micrometers which is a thickness not affecting the guided mode. That is, the absorption layer 130 is located distant enough not to affect exudation of guided mode light into the cladding layer.

After that, the InGaAsP layer 104 is grown approximately 0.3 micrometers thick. Crystal growth heretofore is progressed continuously. On the surface of the waveguide layer 104, sawtoothed asymmetric second-order gratings 110 having a blaze angle in the illustrated direction are made to form a waveguide,. The gratings can be made, for example, by applying a resist onto the surface of the waveguide layer 104, exposing it by EB (electron beam) exposure, then treating the surface by ion milling while inclining the substrate, and finally finishing the surface with an appropriate etchant. The depth of gratings obtained in this manner is approximately0.1 micrometers.

Next grown thereon the p-type InP cladding layer 105 approximately 1 micrometer thick. Further grown is the p-type InGaAsP layer 106 for surface protection. These layers are p-type layers here, taking it into account that the optical isolator may be integrated with a DFB laser. However, they may be n-type layers if exclusively used as an independent optical isolator.

Finally, the reflection structure 120, which may be a dielectric multi-layered film, is stacked. Reflectance of the reflection structure 120 may be, for example, approximately 95%. The reflection structure 120, similarly to the absorption layer 130, is located almost outside the region where the guide mode may exude, so as to prevent affection to the guided mode light. In this manner, the optical isolator shown in FIG. 7A is completed.

Next explained is the operating means of the optical isolator according to the invention.

The optical isolator shown in FIG. 7A has second-order of higher-order diffraction gratings. A waveguide structure, especially having second-order gratings, emits radiation mode light vertically to the waveguide direction to both the substrate side and the superstrate side. Second-order gratings of the optical isolator of FIG. 7A has a cross-sectional configuration asymmetric in the propagating direction, that is, having a blase angle. Thus, the blaze angle intensifies the radiation mode on the substrate side or the radiation mode on the superstrate side, relative to the propagating direction of optical waves in one of the left and right directions. If the traveling direction of optical waves is reversed, then the distribution ratio between the substrate side and the superstrate side is also reversed.

More specifically, in FIG. 7A, in the case where the guided light travels from right to left, almost all of the radiation mode light is emitted toward the substrate 101 as shown by arrow C. This light is absorbed by the absorption layer 130, not returning to the waveguide, and makes the guiding loss.

In the case where the guided light travels from left to right, almost all of the radiation mode light is emitted upward to the opposite side from the substrate as shown by arrow A. This light is reflected by the reflection structure 120 and returns to the waveguide structure as shown by arrow B. Therefore, when light ravels from left to right, the loss in the waveguide is small. The principle of this structure can be understood from a one-dimensional slab structure.

Figure 8:
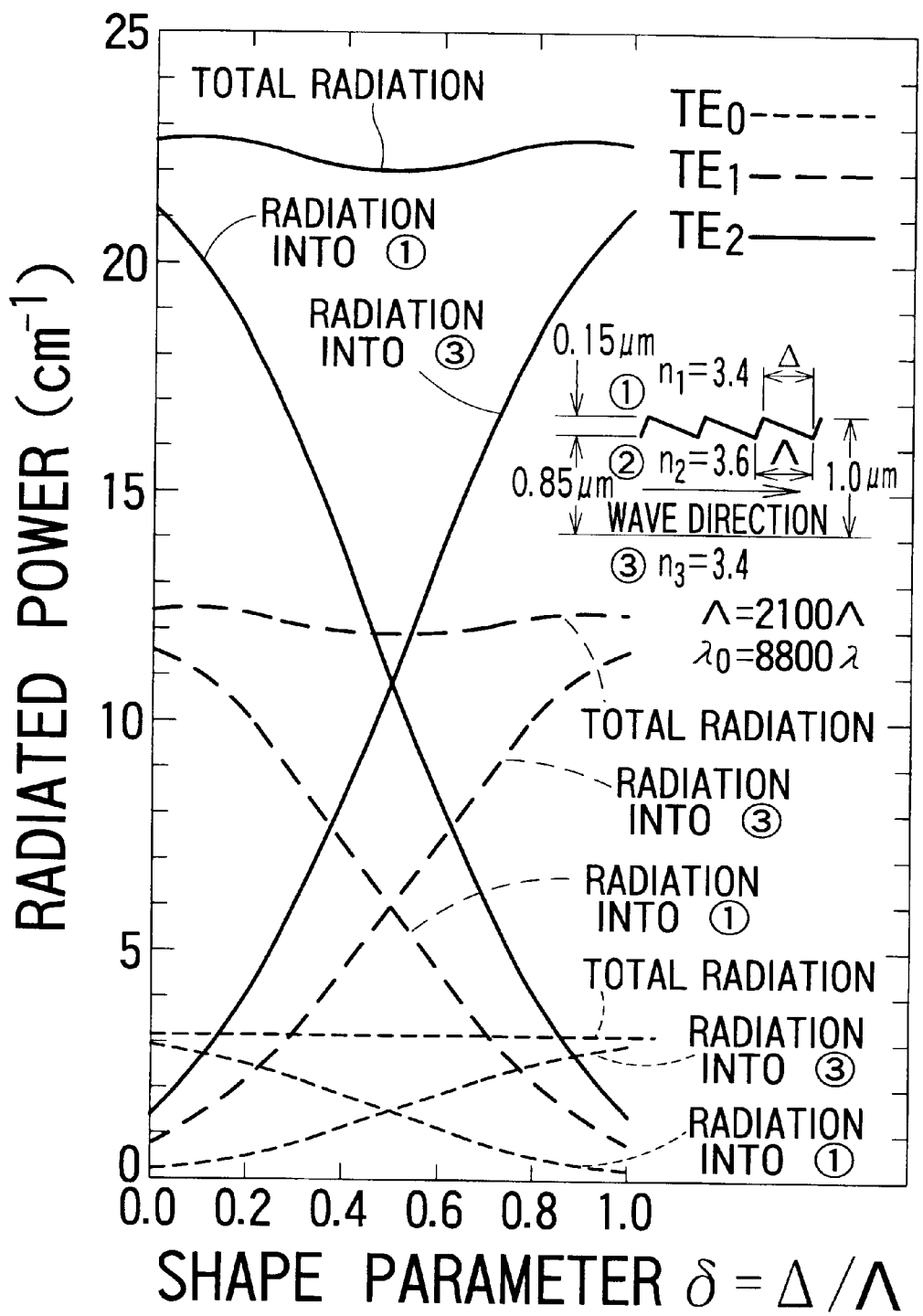
FIG. 8 is a graph showing exemplary waveguide characteristics of asymmetric diffraction gratings.

FIG. 8 is a graph showing waveguide characteristics of asymmetric diffraction gratings. his is a graph printed in IEEE Journal of Quantum Electronics, vol. QE-12, pp. 4494–4499, 1976, under the title "Analysis of Grating-Coupled Radiation in GaAs:GaAlAs Lasers and Waveguides—II: Blazing Effects" by Strefer, et al. The horizontal axis of FIG. 8 represents shape parameters $\delta$ of diffraction gratings, and the vertical axis represents optical outputs emitted from diffraction gratings. The shape parameter $\delta$ on the horizontal axis shows asymmetry (blaze angle) of the cross-sectional configuration of a diffraction grating. As shown by an inserted diagram in FIG. 8, $\delta=\Delta/\Lambda=0.5$ is the shape parameter of a diffraction grating having a symmetric cross-sectional configuration. It is quantitatively understood from the inserted diagram that, if guided light travels from left to right and $\delta=\Delta/\Lambda=1.0$, then the radiation mode (3) to the substrate side increases, and the radiation mode (1) to the opposite side decreases.

In the present invention, a reflection structure is provided only on one side of such asymmetric diffraction gratings. Since the reflection structure makes the radiation mode return to the waveguide structure, the loss in the waveguide structure is reduced. That is, the loss of the guided light travelling in this direction decreases.

Guided light travelling in the opposite direction is equivalent to the case of $\Delta/\Lambda=1$, and the radiation mode (1) in the direction opposite from the substrate increases significantly. Since no reflection structure exists in this direction, the loss in the waveguide structure increases.

Utilizing the non-reciprocity of directions of guided light as explained above, the invention can realize the structure which guides only the guided light in one direction (in this case, direction from lift to right) under a small loss, and can realize a very compact waveguide optical isolator having a high direction selectivity.

In contrast, conventionally proposed optical isolators were bulky in size, and were difficult to monolithically integrate with DFB laser elements because of a difference in material from DFB lasers.

Therefore, they were fabricated as separate parts from DFB lasers, and had to be assembled by adjusting their optical axes to meet with each other. Moreover, since these conventional optical isolators required a magnetic field, they involved problems, namely, bulky sizes, high prices and high costs of modules mounting DFB lasers.

Taken these problems into consideration, optical isolators of a completely different type, which can be integrated on a semiconductor substrate, have been proposed. Literatures disclosing optical isolators of this type involve, for example, Japanese Patent Laid-Open Publication No. H8-179142.

Figure 14:
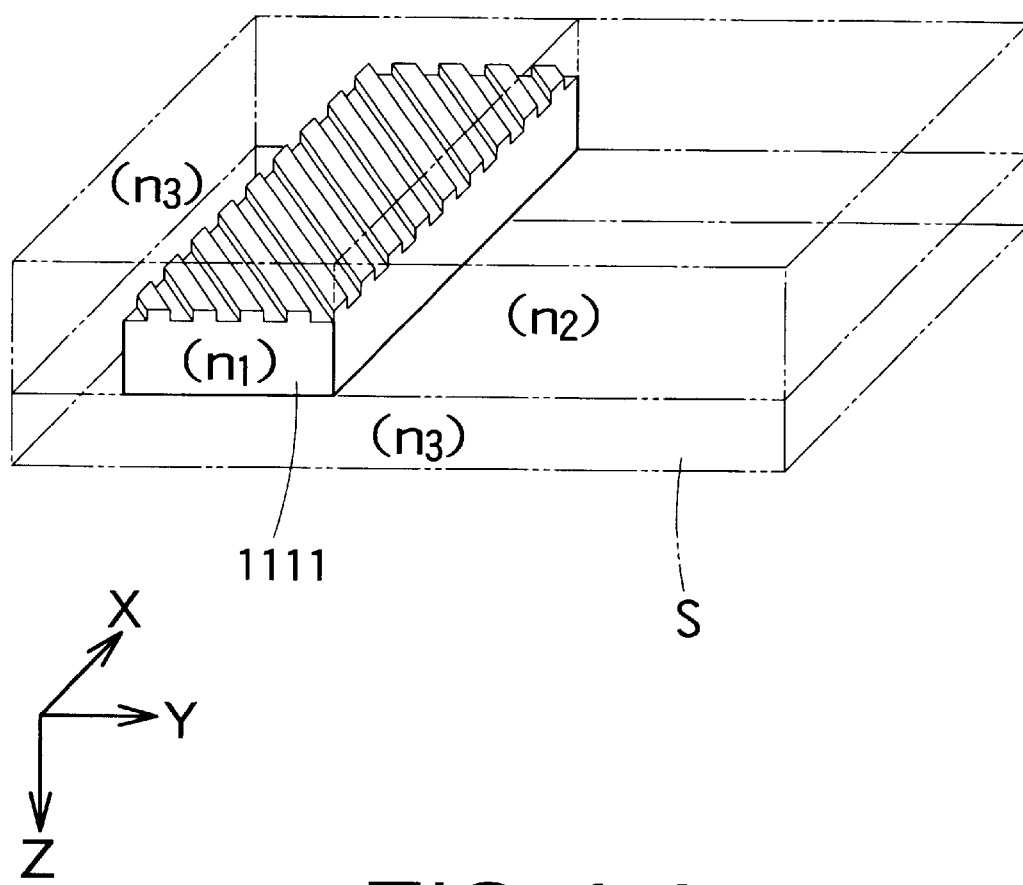
FIG. 14 is a conceptional, perspective view showing general construction of a conventional optical isolator.

FIG. 14 is a conceptional perspective view schematically illustrating construction of one of these conventional optical isolators. The optical isolator shown here is configured to locate diffraction gratings 1111 aslant of the waveguide direction on a semiconductor substrate S, in order to decrease the refractive index n2 on one side of the waveguide structure to establish asymmetry while dispersing return light as the radiation mode to the n2 side.

This arrangement, however, involves the following drawbacks.

That is, since the waveguide structure is asymmetric on left and right sides, output beams exhibit left-and-right asymmetric distribution, and the coupling force with optical fibers deteriorates. Moreover, since the layer with the different refraction index n2 must be made separated by crystal growth, the manufacturing process is complicated. Furthermore, it involved another problem that, when inclined diffraction gratings are used, its coupling as a DFB laser deteriorates.

That is, in the conventional optical isolator shown in FIG. 14, semiconductor layers are burying opposite side surfaces of the waveguide extending vertically of the drawing sheet were required to be different in composition (different in refractive index) from each other. In contrast, the invention removes such requirement. That is, the invention permits completely the same stripe structure as used conventionally. Therefore, the invention does not increase any subsequent step. Additionally, it has the advantage that NFP (near field pattern) of the guided mode is symmetric, and can be readily coupled optically to fibers.

Figure 7B:
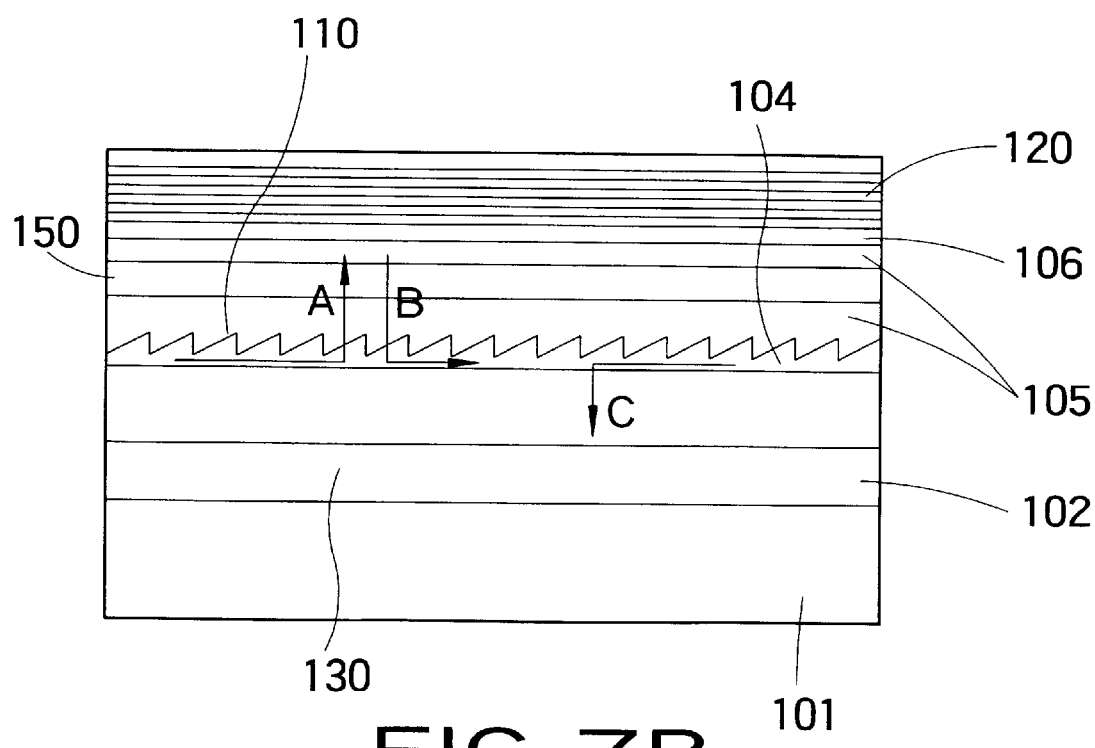
FIG. 7B is a conceptional, cross-sectional view showing a modified version of the optical isolator shown in FIG. 7A.

FIG. 7B is a conceptional cross-sectional view illustrating a modified version of the optical isolator shown in FIG. 7A.

In the isolator shown here, gain media 150 are provided between the diffraction gratings 110 and the reflection structure 120.

Radiation mode light radiated upward to the side opposite from the substrate as shown by arrow A is amplified by the gain media 150, reflected by the reflection structure 120, again amplified by the gain media 150 and returns to the waveguide 104. That is, guided light travelling from left to right in FIG. 7B is amplified very effectively, and the directivity of the isolator is so much further improved.

Next explained is the second isolator according to the invention.

Figure 9A:
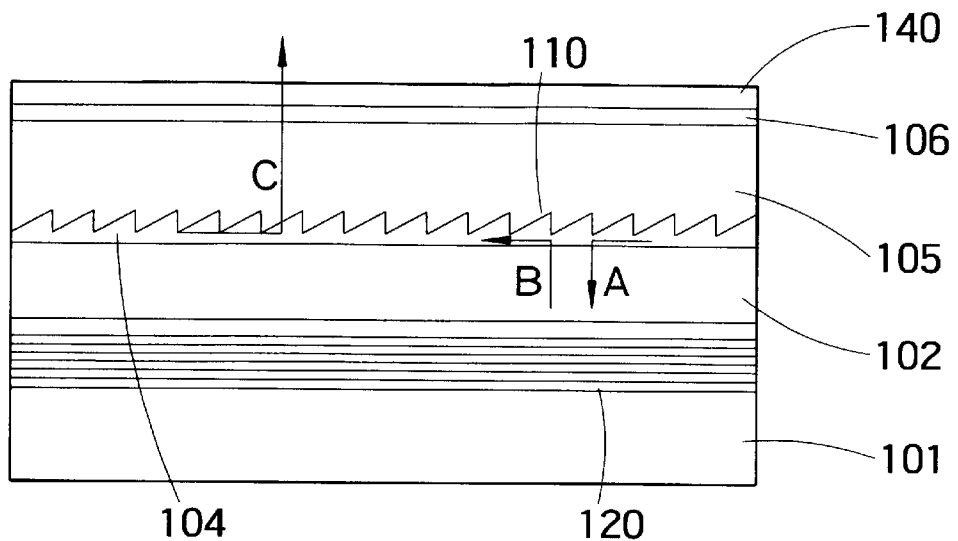
FIG. 9A is a cross-sectional, conceptional diagram showing construction of a central part of a second optical isolator according to the invention.

FIG. 9A is a cross-sectional conceptional diagram illustrating construction of a central part of the second optical isolator according to the invention. Here again, second-order of higher-order diffraction gratings 110 are provided, and a reflection structure and an absorption structure are provided above and below the gratings 110.

The second optical isolator is different from the first optical isolator in the following two points.

1) The reflection structure 120 is provided below the gratings 110 in lieu of the absorption layer 130.

2) An anti-reflection coat (AR coat) 140 is provided above the gratings 110 in lieu of the reflection structure 120.

The reflection structure 120 may be a high-reflectivity DBR (distributed Bragg reflector) in form of a multi-layered structure of semiconductor crystal layers, for example. Usable as the anti-reflection coat 140 is, for example, a ¼ wavelength film, i.e. a dielectric thin film having a thickness of $\lambda/4n$ where $\lambda$ is the wavelength of radiation mode light and n is the refractive index. The other components may be the same as those of the first optical isolator explained above with reference to FIG. 7A. So, common reference numeral are attached to them, and their detailed explanation is omitted.

In the embodiment shown here, its only difference is that the functions of reflection and absorption are reversed between upper and lower locations of the gratings 110, and the principle of its operation is identical to that of the first optical isolator. That is, guided light travelling from right to left in FIG. 9A is emitted downward by the gratings 110 as shown by arrow A. Then, it is reflected by the reflection structure 20 back to the gratings 110 as shown by arrow B, and travels them to the left.

On the other hand, guided light travelling from left to right in FIG. 9A is emitted upward by the gratings 110 as shown by arrow C. Since the reflectance of the anti-reflection coat 140 provided above the gratings 110 is very low, light from the gratings 110 is not reflected but released externally, and the component returning to the gratings 110 is very small.

As a result, in the optical isolator shown in FIG. 9A, the guiding loss of a component of guided light travelling from left to right in FIG. 9A is large, and the guiding loss of a component of guided light traveling from right to left is small. In this manner, a directivity is established to enable operation as an optical isolator.

Also in the embodiment shown here, various effects explained with reference to FIG. 7A can be obtained similarly.

Figure 9B:
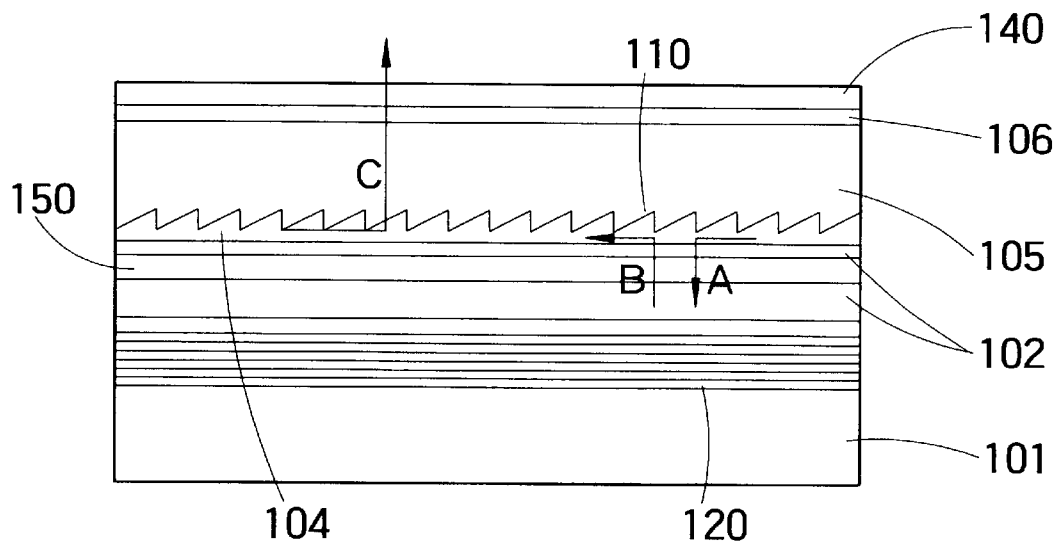
FIG. 9B is a cross-sectional view schematically showing a modified version of the optical isolator shown in FIG. 9A.

FIG. 9B is a schematic cross-sectional view showing a modified version of the optical isolator of FIG. 9A. That is, the isolator shown here has formed gain media 150 between the waveguide 104 and the reflection structure 120. Radiation mode light radiated toward the substrate as shown by arrow A is amplified by the gain media 150, reflected by the reflection structure 120, again amplified by the gain media 150 and returns to the waveguide 104. That is, guided light travelling from left to right in FIG. 9B is amplified very effectively, and the directivity of the isolator is so much further improved.

Next explained in the third optical isolator according to the invention.

Figure 10A:
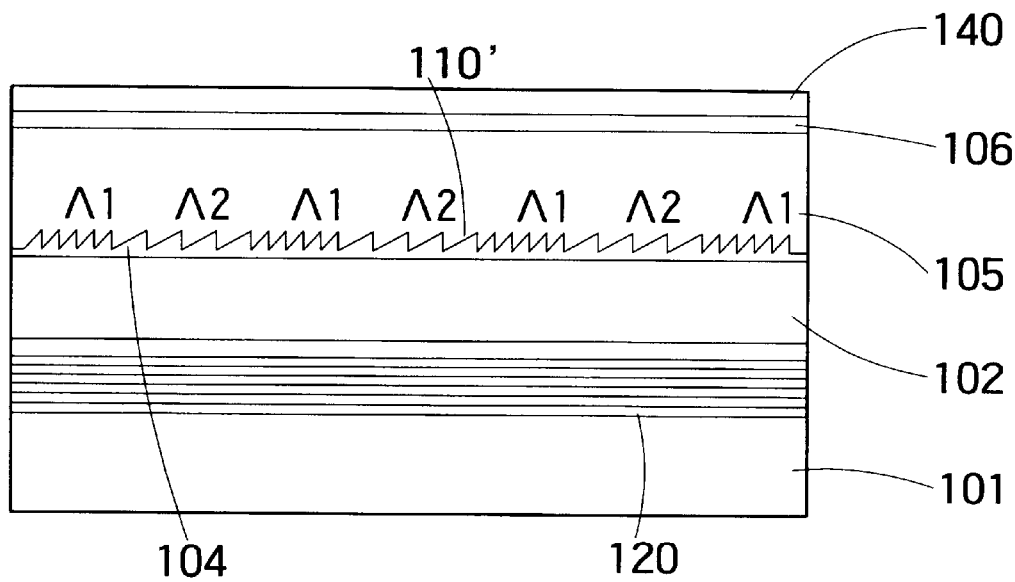
FIG. 10A is a cross-sectional, conceptional diagram showing construction of a central part of a third optical isolator according to the invention.

FIG. 10A is a cross-sectional conceptional diagram illustrating construction of a central part of the third optical isolator according to the invention. Here again, diffraction gratings 110' are provided, and the absorption structure 140 and the reflection structure 120 are provided above and below the gratings 110', respectively. The basic structure and its function are substantially the same as those of the second optical isolator explained with reference to FIG. 9A. So, components thereof are labeled with common reference numerals, and their detailed explanation is omitted.

An important feature of the instant embodiment lies in that gratings 110' have two kinds of periods, $\Lambda 1$ and $\Lambda 2$. In this manner, it can operate as an optical isolator for two kinds of guide light having different wavelengths corresponding to these periods.

That is, the dynamic range of available wavelengths of the optical isolator can be enlarged.

If a portion with a different period is provided in the gratings along the axial direction of the waveguide, effectively the same effect as that obtained by the phase shift is obtained.

Therefore, the profile of guided light and radiation mode light in the cavity axial direction can be controlled by the phase shifting effect. Moreover, although not shown, by introducing three or more different periods in the gratings, the optical isolator is configured to cope with any of guided light of three or more different wavelengths. If the gratings change in period continuously, the optical isolator is available for any guided light in a range of continuous wavelengths.

The same effect can be obtained also by changing the effective refractive index of the waveguide along its axial direction instead of changing the period of the gratings.

Figure 10B:
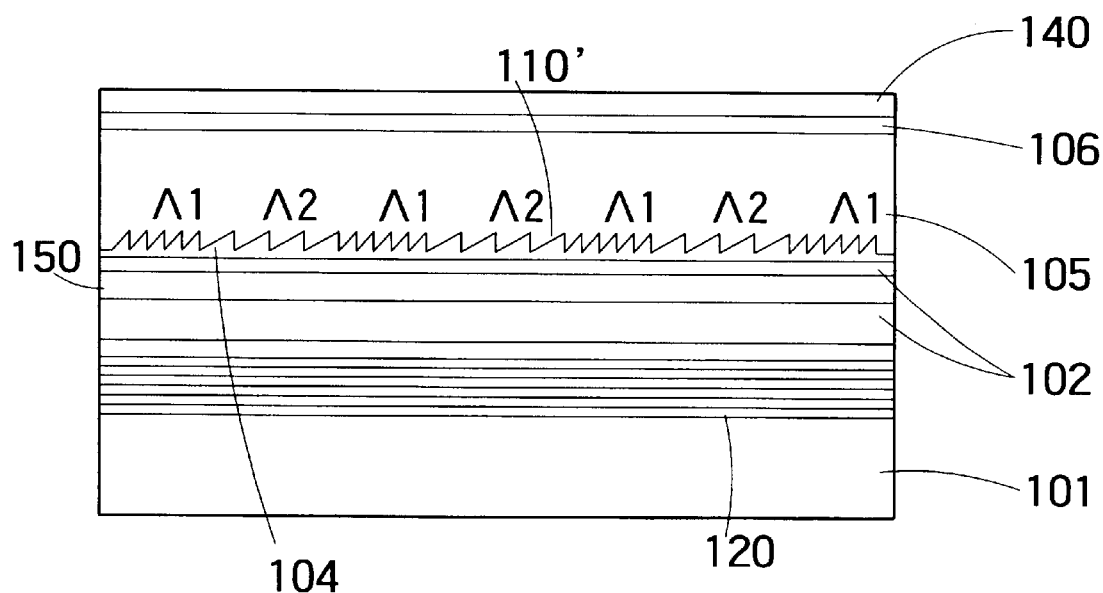
FIG. 10B is a cross-sectional view schematically showing a modified version of the optical isolator shown in FIG. 10A.

FIG. 10B is a schematic cross-sectional view showing a modified version of the optical isolator shown in FIG. 10A. In the isolator shown here, gain media 150 are provided between the waveguide 104 and the reflection structure 120. Radiation mode light radiated toward the substrate as shown by arrow A is amplified by the gain media 150, reflected by the reflection structure 120, again amplified by the gain media 150 and returns to the waveguide 104. That is, guided light travelling from left to right in FIG. 10B is amplified very effectively, and the directivity of the isolator is so much further improved.

Next explained is the fourth optical isolator according to the invention.

Figure 11:
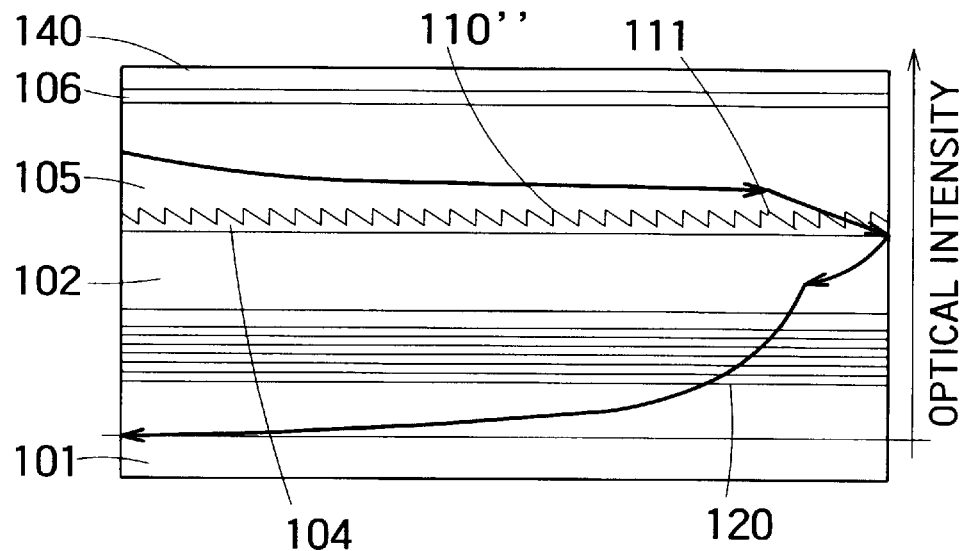
FIG. 11 is a cross-sectional, conceptional diagram showing construction of a central part of a fourth optical isolator according to the invention.

FIG. 11 is a cross-sectional conceptional diagram illustrating construction of a central part of the third optical isolator according to the invention. The optical isolator shown here has a construction similar to that of the second optical isolator explained with reference to FIG. 9A. So, the same or equivalent components thereof are labeled with common reference numerals, and their detailed explanation is omitted.

A different of the instant embodiment lies in that a portion discontinuously shifted in period, that is, a phase shift 111, is provided in the diffraction gratings 110". The shift amount of the phase shift 111 may be, for example, $\lambda/4$ where $\lambda$ is the guide wavelength. The phase shift 111 enables control of the profile of guided light and radiation mode light along the cavity axial direction.

The isolator waveguide shown in FIG. 11 has a good transmittance to right-going guided light and exhibits large attenuation to oppositely traveling light. When light passes the phase shift, the attenuation ratio increases due to a difference in phase between optical waves and the diffraction gratings 110. If the phase shift 111 is provided nearer to the exit (right) of the isolator waveguide of FIG. 11, although attenuation of right-going guided light is small, left-going guided light is largely attenuated because the distance after passing the phase shift 111 is long. This is shown in form of changes in optical intensity by arrow-containing lines. That is, the phase shift 111 promises more effective isolation.

The phase shift introduced in the instant embodiment can be introduced similarly into the first and third optical isolators to obtain smaller effects.

Next explained is a specific example applying the structural features of the first optical isolator to a DFB laser.

Figure 12:
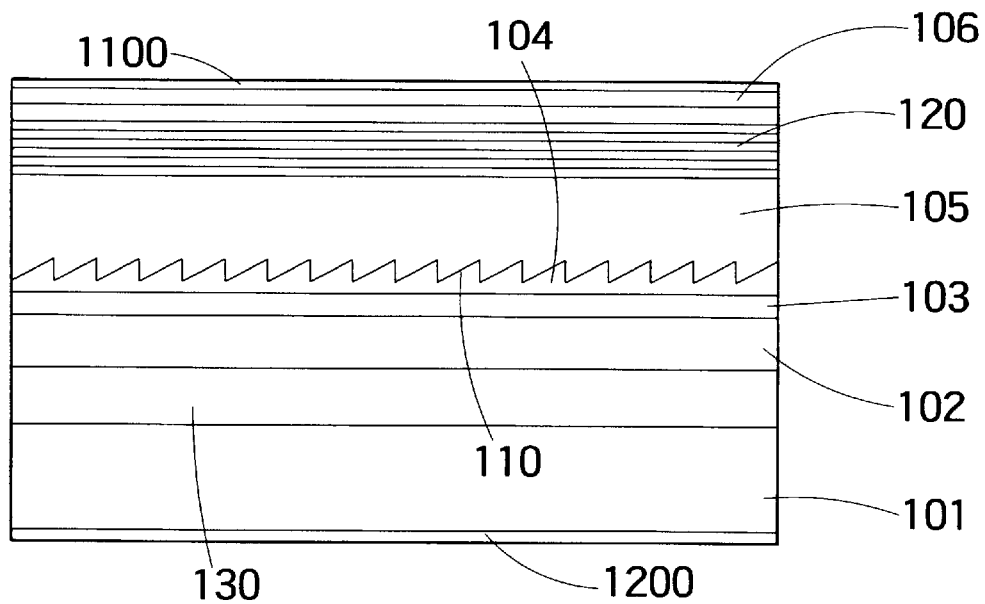
FIG. 12 is a cross-sectional, conceptional diagram showing construction of a central part of a sixth DFB laser according to an embodiment of the invention.

FIG. 12 is a cross-sectional conceptional diagram showing construction of a central part of the sixth DFB laser embodying the invention. That is, the DFB laser according to the embodiment is a specific example which applies the structures and principles of operation of the optical isolators according to preceding embodiments.

The laser shown in FIG. 12 has the same structure as the first optical isolator shown in FIG. 7A, for example. Therefore, the same components as those of FIG. 7A are labeled with common reference numerals, and their detailed explanation is omitted. However, the DFB laser of FIG. 12 has the active layer 103. The active layer 103 has the role of emitting light and guiding the optical waves. The active layer 103 may be either a single semiconductor layer or a multi-layered high-efficiency structure such as MQW (multiquantum well) structure.

The reflection structure 120 is made of a p-type semiconductor layer. The p-type InGaAsP layer 106 plays the role of improving contact with electrodes. Above and below the semiconductor crystal layer, a p-side electrode 1100 and an n-side electrode 1200 are provided for electric conduction.

In DFB lasers, components of guided light traveling in left and right directions are mutually fed back via diffraction gratings and resonate to cause oscillation. In the instant embodiment, due to the same means as that of the first optical isolator shown in FIG. 7A, the radiation mode loss of right-going light is small, and optical output from the right facet increases. In contrast, since the radiation mode loss of left-going guided light is large, the output intensity at the left facet does not increase so much.

That is, the embodiment shown here can improve the slope efficiency in terms of outputs. Additionally, since the laser itself includes the isolator function, resistance to return light is also reinforced. Considering that DFB lasers, in general, are liable to become unstable in oscillation conditions especially by return light, the instant embodiment is particularly effective in this respect.

Furthermore, the embodiment shown here is also effective in improving the single longitudinal mode performance because the gain difference of threshold value between longitudinal modes becomes large.

The invention can similarly provide DFB lasers with structures compatible with optical isolators according to the second to fourth embodiments, in addition to the specific examples shown above. That is, DFB lasers have effects corresponding to the above-mentioned various effects can be obtained by reversing the positional relation between the absorption structure and the reflection structure, changing the period of the diffraction gratings, or introducing a phase shift into the gratings.

It is also possible to use these DFB lasers as surface-emitting lasers. That is, when using as the output the light emitted externally through the reflection structure 20 or the absorption structure in one side of the gratings, a surface-emitting DFB laser can be realized, which is not so high in optical output but remarkably excellent in threshold value and other oscillation characteristics. The surface-emitting DFB laser of this type can be readily integrated with any of optical isolators according to the above-explained embodiments, and a very compact, high-performance optical integrated element combining optical an isolator and a surface-emitting laser can be realized.

Next explained is an optical integrated element combining an optical isolator and a DFB laser.

Figure 13:
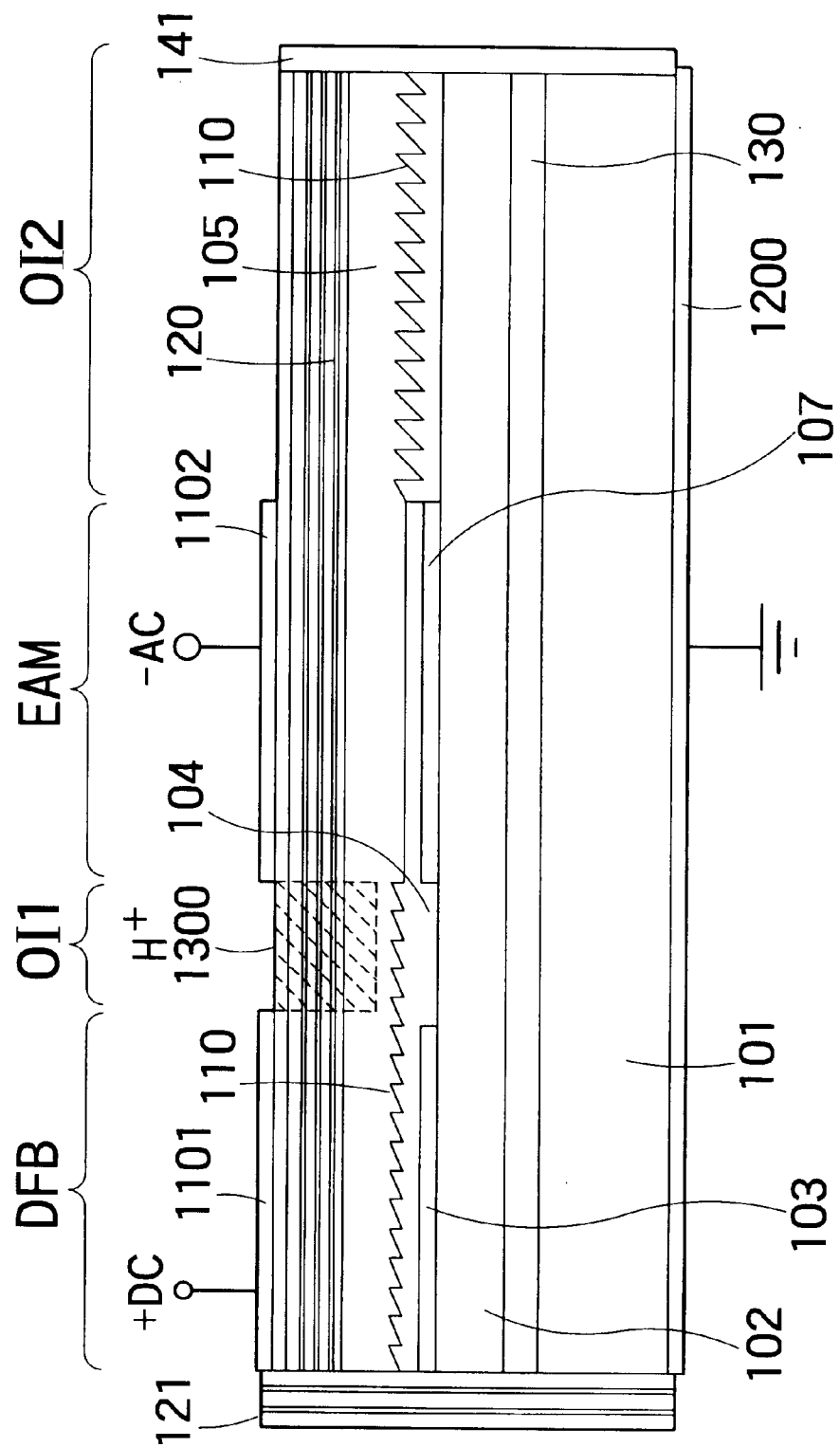
FIG. 13 is a cross-sectional, conceptional diagram showing construction of a central part of an optical integrated element according to an embodiment of the invention.

FIG. 13 is a cross-sectional conceptional diagram showing construction of a central part of the optical integrated element embodying the invention. The optical integrated element according to the embodiment is made by integrating a plurality of elements on a monolithic, i.e. common, substrate. In FIG. 13, a specific example is shown, in which the DFB laser of FIG. 12, optical isolator of FIG. 7A and waveguide EAM (electro-absorption modulator) are integrated monolithically.

The DFB laser is DC-driven via the p-side electrode 1101. The region where the absorption layer 107 lies is EAM.

EAM can be modulated in absorption coefficient by applying a negative voltage to the p-side electrode 1102. Guided light generated in the active layer 103 of the DFB laser is modulated in correspondence with changes in absorption coefficient, and output to the right side in FIG. 13.

An optical isolator OI1 is provided between the DFB laser and EAM. The optical isolator OI1 has a proton ($H^+$) bombarded region 1300 to electrically isolate DFB from EAM. Also regarding guided light, unless the DFB laser is isolated from EAM, return light is input to the DFB laser and causes undesirable fluctuation of optical output and wavelength. According to the embodiment shown here, by merely removing the active layer between the DFB laser and EAM, the optical isolator can be integrated easily. Additionally, another optical isolator OI2 can be integrated also on the output side of EAM in a similar simple process, and return light from the exterior can be prevented.

According to the instant embodiment, the DFB laser, optical isolator OI1, EAM and second optical isolator OI2 can be integrated very compactly. Additionally, since these elements shares the waveguide, their optical coupling is ensured sufficiently.

Furthermore, according to the embodiment, since the absorption layer 130, gratings 110 and reflection structure 120 of the optical integrated element can be made in a common manufacturing process, a high-performance optical integrated element can be made in a simple process.

In optical isolators or integrated elements explained with references FIG. 7A to FIG. 13, positional relation of gratings, reflection structure, absorption/anti-reflection structure, as well, is not limited to upper and lower directions of the substrate. For example, diffraction gratings may be formed on a side surface of the waveguide, that is, a surface vertical to the substrate, and the reflection structure and the absorption structure may be located at opposite sides thereof. In this case, the reflection structure, diffraction gratings and absorption structure result in lying in parallel with the substrate surface.

Next explained are optical functional elements having more advanced structures the Inventor has invented, with reference to FIGS. 15 through 32. In elements explained below, radiation mode light emitted from a waveguide having a hologram capable of generating radiation mode light (for example, second-order or high-order diffraction gratings) is amplified by a separate amplifier means, and returned to the waveguide by using a reflection means. Since radiation mode light is emitted to both sides of the waveguide, reflection means is preferably provided at opposite sides. The invention involves a lot of applied inventions based on the unique cavity structure. One of them is an amplifier. The invention also involves optical modulators, laser oscillators, couplers and optical transmission devices using them.

Figure 15:
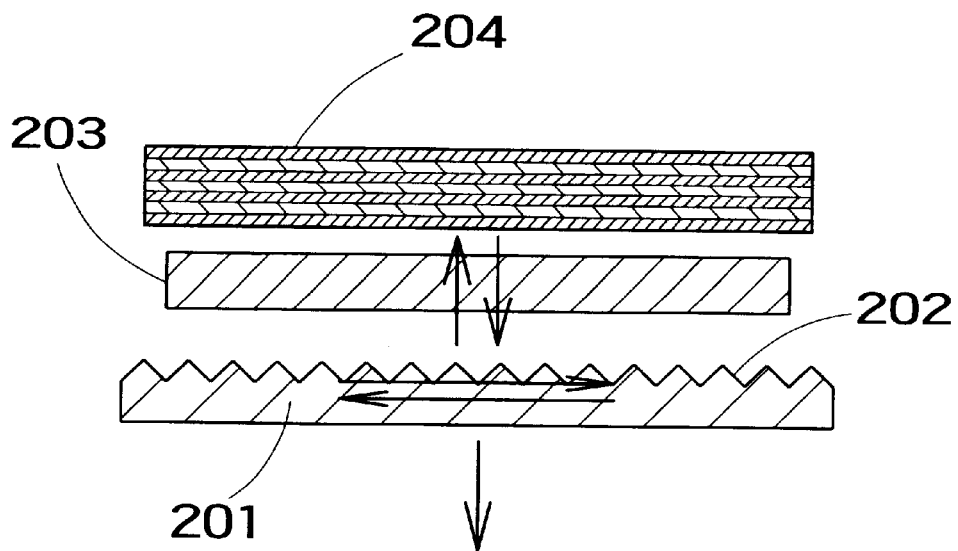
FIG. 15 is a conceptional diagram showing a first optical functional element according to the invention.

FIG. 15 is a conceptual diagram showing the first optical functional element according to the invention.

With reference to FIG. 15, the basic principle of optical functional elements according to the invention is explained. Optical functional elements according to the invention have a waveguide means for guiding light. In illustrated specific examples, an optical waveguide 201 is provided as the waveguide means. Formed on the optical waveguide 201 are second-order diffraction gratings 202. The waveguide 201 may be either an optical fiber, vertically used dielectric waveguide or semiconductor waveguide. For example, an InGaAsP/InP waveguide may be used. This is a multi-layered structure (slap waveguide) including an InGaAsP quaternary mixed crystal with a high refractive index as a core which is sandwiched by InP with a low refractive index from upper and lower sides. FIG. 15 shows a longitudinal cross-section, but a two-dimensional buried waveguide sandwiching the core by InP also from the lateral directions may be used.

Part of light guided by the waveguide 201 having the second-order grating 202 is emitted to both upper and lower directions substantially vertically of the waveguide direction. This is the radiation mode light.

The present invention employs a structure where the radiation mode light is guided through the amplifier means 203. The amplifier means 203 functions to amplify light. It may be either EDFA (erbium-doped fiber amplifier), SOA (semiconductor optical amplifier), optically pumped gain media, or any other appropriate element. For example, it may be a p-n junction of an electrically conducted InGaAsP/InP multi-layered structure.

However, the amplifier means 203 is preferably located sufficiently distant not to directly disturb the function of guiding the guided mode by the waveguide 201. This is in accordance with the concept of the invention that a cavity structure is made for optical waves converted from the guided mode to the radiation mode.

Beyond the amplifier means 203, the reflection means with a high reflectance is located. The reflection means 204 functions to reflect radiation mode light with a high reflectance, and it may be a dielectric multi-layered film, for example. Radiation mode light reflected by the reflection means 204 is again amplified in the amplifier means 203, and returns to the waveguide 201 via the gratings 202. By repeating the cycle of amplification, reflection and amplification, a unique cavity structure can be realized. More specific structures of optical functional elements will be described later.

Next explained is the second optical functional element according to the invention.

Figure 16:
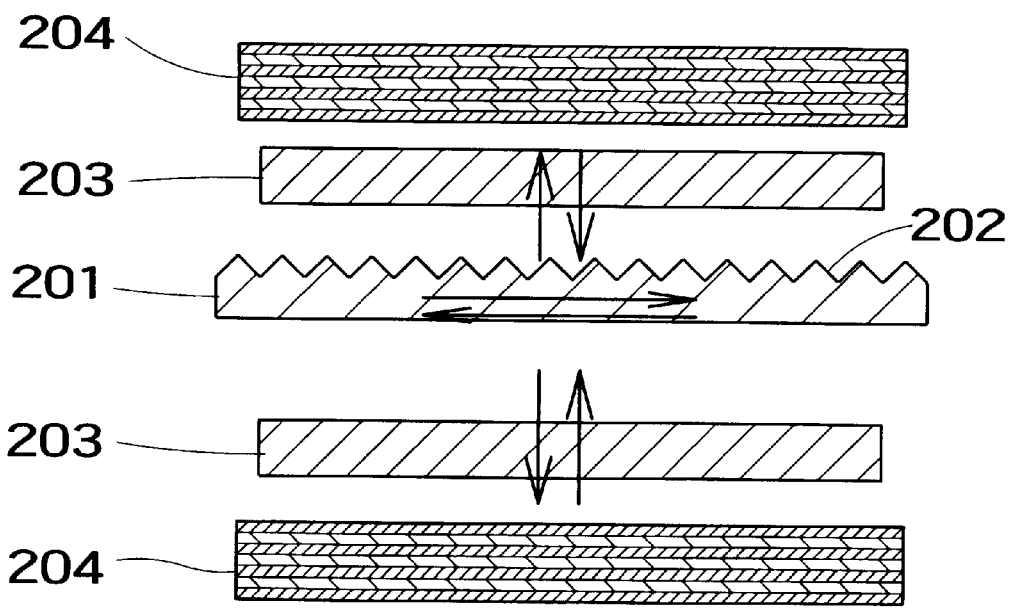
FIG. 16 is a conceptional diagram showing a second optical functional element according to the invention.

FIG. 16 is a conceptional diagram showing the second optical functional element according to the invention. That is, in the element shown here, a more intensive cavity means is realized by providing the above-explained cavity structure both above and below the waveguide 201. That is, components of radiation mode light emitted upward and downward of the waveguide 201 undergo the cycle of amplification, reflection and amplification.

One of features of the radiation mode is that it can be output in form of sharp beams throughout the entire region where the diffraction gratings exist. Therefore, radiation mode light has a flexibility permitting construction of various optical functions along the waveguide, unlike outputs of waveguide facets regarded as a point light source. For example, there is the function of collecting input and output light for coupling with other optical elements. More specifically, there are lens functions, different holograms, and optical isolators, for example.

Figure 17:
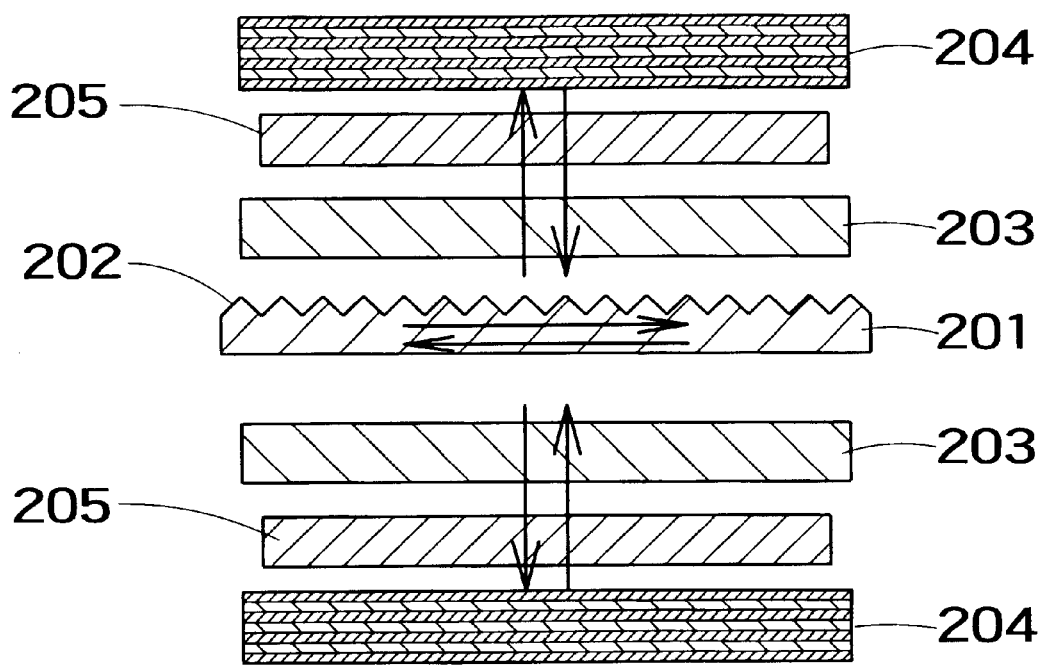
FIG. 17 is a conceptional diagram showing a third optical functional element according to the invention.

FIG. 17 is a conceptional diagram showing the third optical functional element according to the invention. Here again, parts or components identical or equivalent to those of the embodiments already explained with reference to FIGS. 15 and 16 are labeled with common reference numerals, and their detailed explanation is omitted. The embodiment shown here is a version including a phase control means 205 in addition to the construction of the second optical functional element explained above. The phase control means 205 has the function of controlling the phase of light to adjust the phase of reflected light so that the reflected light from the reflection means 204 can efficiently couple to the waveguide 201 via the gratings 202.

Thus, the coupling efficiency of reflected light to the waveguide 201.

A concrete example of the phase control means 205 is in InGaAsP/InP slab waveguide structure having a p-n junction. By electrically feeding the p-n junction of the waveguide or applying a reverse bias electric field, the refractive index changes, and the phase of light can be controlled. The phase control means 205 may be interposed between the amplifier means 203 and the reflection means 204, or between the waveguide 201 and the amplifier means 203. The amplifier means 203 can be changed carrier density and hence in refractive index by electrical supply. In an application, it may be cancelled by the phase control means 205.

The basic structure of optical functional elements according to the invention have been explained above with reference to FIGS. 15 through 17.

Next explained is the theoretical background of the cavity structure according to the invention.

Assume here an aspect where a wavelength having second- or higher-order diffraction gratings oscillate due to distribution feedback. In an analysis method proposed by the Inventor, amplitude of a radiation mode within the gratings is approximated by the following equation.

$$a(x) = -\frac{e^{-jkx}}{2}\left(\int_0^x e^{jk\xi}T'(\xi)d\xi + C_a\right) \quad (1)$$

$$b(x) = -\frac{e^{jkx}}{2}\left(\int_0^x e^{-jk\xi}T'(\xi)d\xi + C_b\right) \quad (2)$$

Here is assumed that the diffraction gratings extend from x=0 to x=g in the coordinates of the waveguide. In Equation 1, a(x) represents the amplitude of the radiation mode emitted downward from the lower end (x=0) of the grating region whereas, in Equation (2), b(x) represents the amplitude at x of the radiation mode emitted upward from the upper end (x=g) of the grating region. T(x) is a function determined by Fourier coefficients of the gratings and the field of the guided mode.

$C_a$ and $C_b$ are constants determined by boundary conditions.

Under the boundary conditions where radiation modes emitted upward and downward of the waveguide is reflected by reflection means, respectively, these constants are determined. Reflectivity above the waveguide is $r_g$, and amplitude reflectivity below the waveguide is $r_0$.

These reflectives involve phase as well. Influences from the layer structure after the radiation mode is emitted from the gratings up to the reflection means is involved in the reflectivities, and they are determined under the assumption that the reflection means exists along the boundary of the grating region. That is, here is assumed as $a_n(g)=r_g b_n(g)$, $b_n(p)=r_0 b_n(0)$.

Then, constants $C_a$ and $C_b$ can be expressed by the following equations.

$$C_a = \frac{r_g B e^{j2kg} - A}{1 - r_0 r_g B e^{j2kg}}, \quad (3)$$

$$C_b = r_0 \frac{r_g B e^{j2kg} - A}{1 - r_0 r_g B e^{j2kg}} = r_0 C_a$$

However, the following equation was defined.

$$A \equiv \int_0^x e^{jk\xi}T'(\xi)d\xi, \quad B \equiv \int_0^x e^{-jk\xi}T'(\xi)d\xi \quad (4)$$

What is important here is the denominator of Equation (3).

That is, if the following equation is established:

$$r_0 r_g B e^{j2kg}=1 \quad (5)$$

The denominator of Equation (3) becomes zero, and constants $C_a$ and $C_b$ become infinities. That is, as understood from Equations (1) and (2), the cavity oscillates as a "radiation mode cavity". In other words, it is understood that oscillation occurs when the reflectance is large, a gain is ensured, and the phase condition is satisfied.

From the viewpoint of the waveguide, since a radiation mode heretofore being a loss is amplified and returns in the present invention, it makes a gain. Therefore, the radiation mode loss in the equation of coupled waves used in analysis of DFB lasers is replaced by a gain term. Even if the radiation mode cavity does not mature to the oscillation condition, oscillation is possible at a low threshold value also as a DFB laser.

It is easy to understand from the explanation made here that claims of the present invention claim three elements for radiation modes, namely, the amplifier means, reflection means and phase control means.

Construction shown in FIGS. 15 through 17 is the basis of various elements explained below. In the present invention, however, components like the amplifier means and reflection means need not exist independently from each other. For example, like the optical functional element next explained with reference to FIG. 18, two or more means may be commonly involved in a single component.

Figure 18:
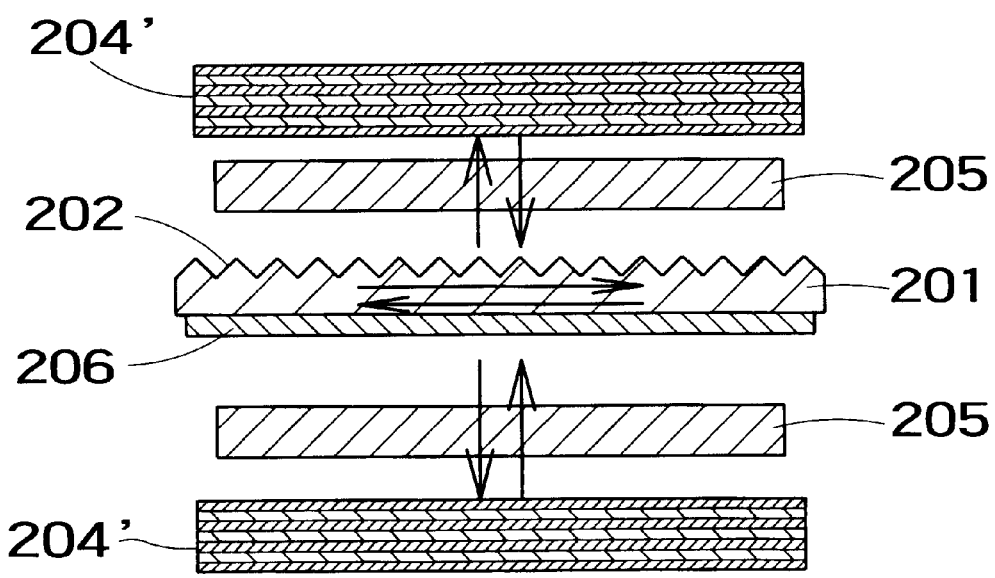
FIG. 18 is a conceptional diagram showing construction of a fourth optical functional element according to the invention.

FIG. 18 is a conceptional diagram showing construction of the fourth optical functional element according to the invention. Here again, components or parts identical or equivalent to those of the embodiments shown in FIGS. 15 through 17 are labeled with common reference numerals, and their detailed explanation is omitted. The optical functional element of FIG. 18 includes no media 203 having a gain. Instead, it includes an active layer 206 having a gain near the waveguide 201. The reflection means 204' also has a gain. That is, the active layer 206 and reflection means 204' behave as amplifier means.

In order for the reflection means to have a gain, a p-n junction may be made in DBR (distributed Bragg reflector) in form of a multi-layered film of semiconductors stacked in parallel in the substrate surface to make it have a gain by current injection, or another waveguide may be made vertically to the waveguide 201 to make DBR therein.

Next explained is the fifth optical functional element according to the invention.

Figure 19:
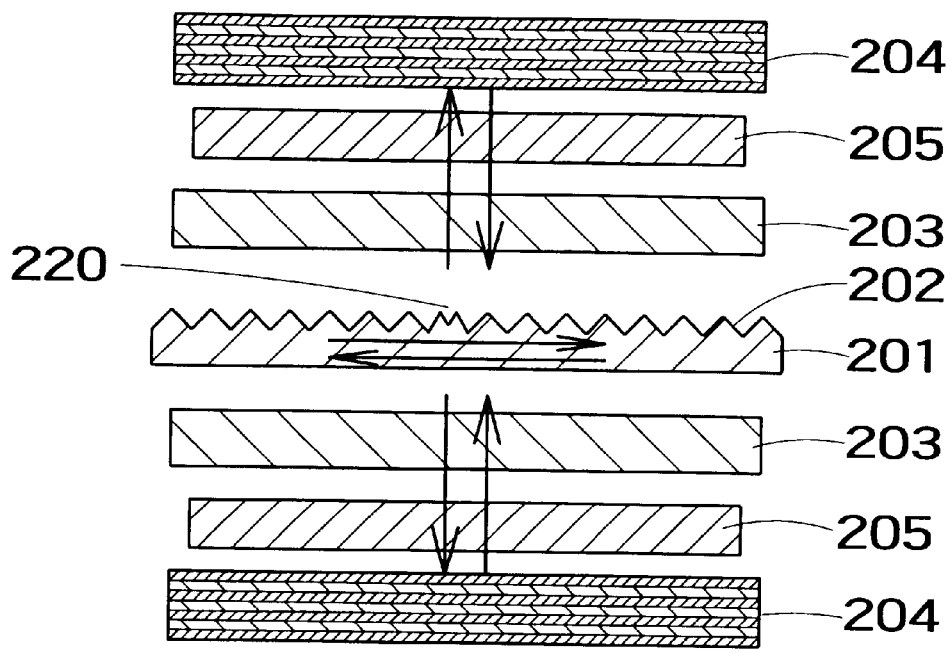
FIG. 19 is a conceptional diagram showing a fifth optical functional element according to the invention.

FIG. 19 is a conceptional diagram showing the fifth optical functional element according to the invention. Here again, components or parts identical or equivalent to those of the embodiments explained with reference to FIGS. 15 through 18 are labeled with common reference numerals, and their detailed explanation is omitted. In the example shown in FIG. 19, second- or higher-order diffraction gratings 202 have a phase shift 220, i.e. a phase discontinuity. the phase shift 220 is effective for control of intensity profile of radiation modes parallel to the waveguide. That is, if a radiation mode generates from the waveguide, the waveguide accepts two waves opposite in travelling direction. The intensity profile of radiation modes in the axial direction, i.e. in the waveguide direction, is largely affected by interference of radiation modes generated by these two guided modes, which strengthen or weaken each other. The state of their interference changes with phase shift. Therefore, the use of an appropriate phase shift is a great merit. Moreover, since the phase shift affects the axial intensity of guided modes themselves, it can be in important component of the present invention.

That is, without the phase shift, a longitudinal mode with a small radiation mode intensity oscillates in a central portion of the waveguide. In contrast, when suppressing reflection from opposite facets of the waveguide low, providing a phase shift corresponding to $\lambda/r$ in the center of the waveguide, and inviting DFB (distributed feedback) oscillation of the waveguide, longitudinal modes oscillate with large intensities in guided modes and radiation modes in a central portion of the waveguide.

That is, the axial intensity profile of radiation modes fed back with a gain and the intensity of the guided mode coincide. Since they spatially strongly synchronize in the phase shifting position, there is obtained the effect that the optical feedback, i.e. the efficiency of the cavity, increases remarkably.

Also when structure for changing the effective refractive index of the waveguide is employed instead of such phase shift, the same effect can be obtained. That is, even when the gratings have a uniform period, the same effect can be obtained by providing an effective phase shift region (not shown) made by changing the width, thickness or refractive index of the waveguide structure. The phase shift preferably has a phase shift amount in the range from several integer times the guide wavelength$\lambda/r$ to a value not smaller than ⅛ and not larger than ⅜. The above-raised value ¼ is the center value of this range.

Figure 20:
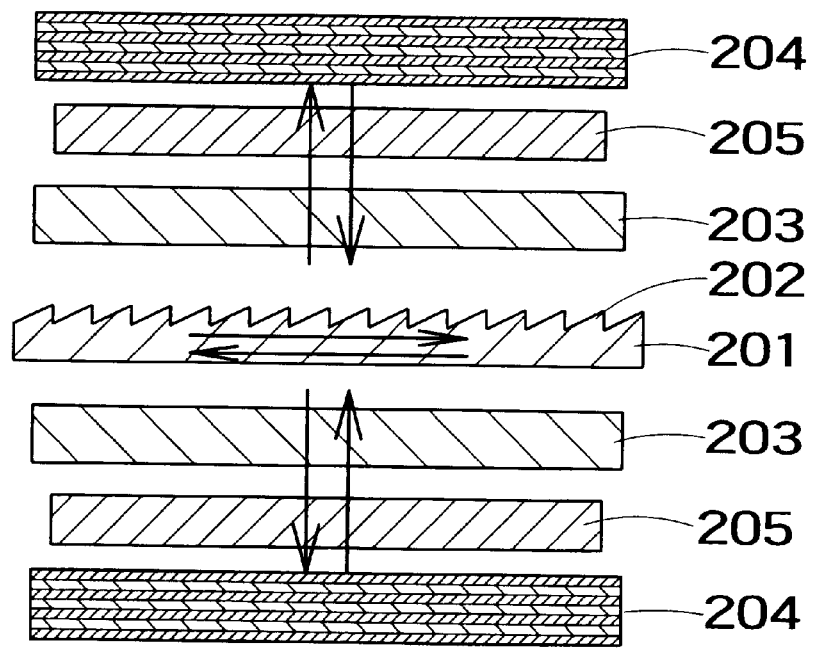
FIG. 20 is a conceptional diagram showing a sixth optical functional element according to the invention.

FIG. 20 is a conceptional diagram showing the sixth optical functional element according to the invention. Here again, components or parts identical or equivalent to those of the embodiments explained with reference to FIGS. 15 through 19 are labeled with common reference numerals, and their detailed explanation is omitted. The embodiment shown here has a so-called blaze angle with which the cross-sectional configuration of the diffraction grating 202 is asymmetric. With diffusion gratings with a symmetric cross-sectional configuration having no blaze angle, radiation modes generated by guided modes travelling in a predetermined direction tend to be emitted uniformly in both upper and lower two directions.

However, a blaze angle makes radiation modes emitted upward and downward to have a selectivity. For example, in FIG. 20, optical wave travelling through the waveguide from left to right are emitted upward of the drawing sheet with a larger ratio, and those in the opposite direction are emitted downward with a smaller ratio.

By introducing such a blaze angle, the following advantages are obtained. That is, when signal light always propagates in one direction relative to the waveguide, radiation modes emitted upward or downward of the waveguide can be enlarged by a blaze angle. Then, when the means on one side is reinforced by increasing the reflectance on the larger part or by increasing the gain of the amplifier means, the function can be reinforced efficiently. Moreover, by reducing the amplifying effect of signals propagating in the opposite direction, functions as an optical isolator or directional coupler can be established. These are as already explained with reference to FIGS. 7A and 13.

Next explained is the seventh optical functional element according to the invention.

The optical functional element shown here can be explained by using the constructions shown in FIGS. 15 through 20. That is, in this embodiment, the waveguide means, amplifier means and reflection means are modulated independently from each other. These are basic requirements of optical active devices dealing with optical signals, together with the phase control means explained above with reference to FIG. 17.

For example, conditions defined by the above-introduced Equation (5) are satisfied by modulating the amplifier means, and oscillation of the cavity vertical to the waveguide can be controlled by current injection. Other means, such as waveguide means and reflection means, can be similarly modulated in parameter.

Next explained is the eight optical functional element according to the invention.

Figure 21:
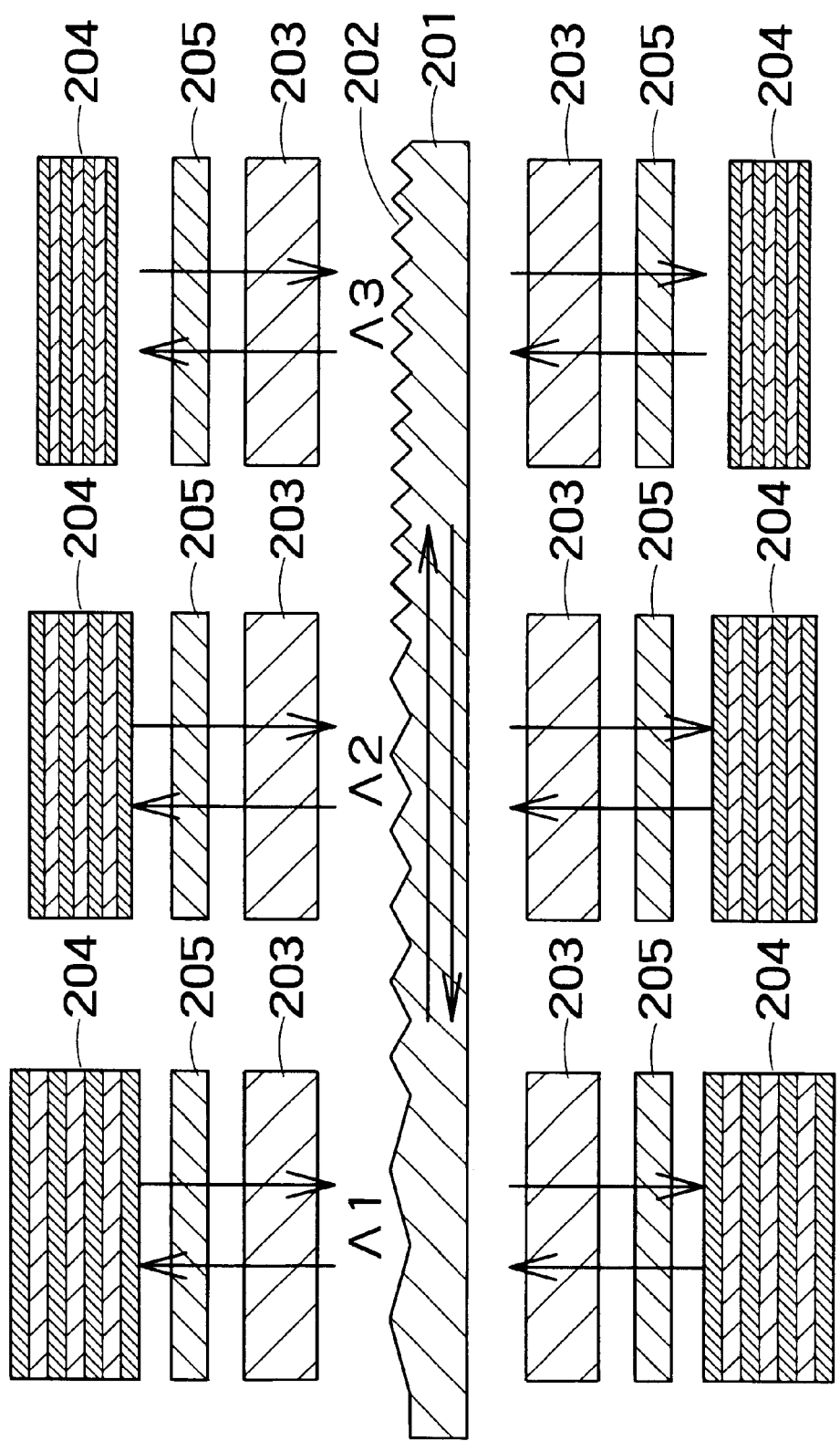
FIG. 21 is a conceptional diagram showing an eighth optical functional element according to the invention.

FIG. 21 is a conceptional diagram showing the optical functional element according to the embodiment. Here again, components or parts identical or equivalent to those of the embodiments explained with reference to FIGS. 15 through 20 are labeled with common reference numerals, and their detailed explanation is omitted. In the embodiment shown here, another cavity structure using radiation modes is made along the cavity. Making it along the waveguide means the use of the entire length of the long waveguide.

Therefore, the cavity structure can be made to be variable along the waveguide. It is also possible to make a number of cavity structures along the waveguide.

In the example shown in FIG. 21, the diffraction gratings 202 of the waveguide structure 201 changes in period along the waveguide. In this example, the gratings have three kinds of periods, $\Lambda 1$, $\Lambda 2$, and $\Lambda 3$. In association with respective diffraction gratings different in period, the reflection means 204, phase modulator means 205, amplifier means 203 are provided.

Behaviors of the optical functional element are explained below. The waveguide 201 is held excited to make it generate spontaneous radiation light. Radiation modes of wavelength components radiated vertically in response to grating periods $\Lambda 1$, $\Lambda 2$, and $\Lambda 3$ among the spontaneous radiation light are amplifier in respective radiation mode cavities. Degree of amplification can be determined by independently controlling the gain, reflectance, phase, and so forth, to desirably amplify selected wavelengths. The reflection means, itself, can be reinforced in wavelength selectivity by employing a structure like DBR. It is also possible to adjust the peak of the gain spectrum to a specific wavelength. If amplification is strong, oscillation is also possible. It is also possible to extract the amplified light from respective cavities. It can also be returned to the waveguide 201 and extracted from its facet. Additionally, it is possible to extract specific wavelength as modulated signals from respective cavities.

Since this construction also functions as a multiplexer and/or a divider, optical circuits can be made as a compact layout in a reduced space. Therefore, it is advantageous for monolithic integration. In the example of FIG. 21, the waveguide means and other means can be integrated monolithically on an substrate of InP, for example. Alternatively, the waveguide, for example, may be id fiber, and the gratings may be fiber gratings.

It is also possible to establish a wavelength selectivity by locally changing the effective refractive index of the waveguide 201 instead of changing the period of the gratings. It will be also possible to change the period of the gratings continuously instead of changing it stepwisely.

Next explained is the ninth optical functional element according to the invention.

Figure 22:
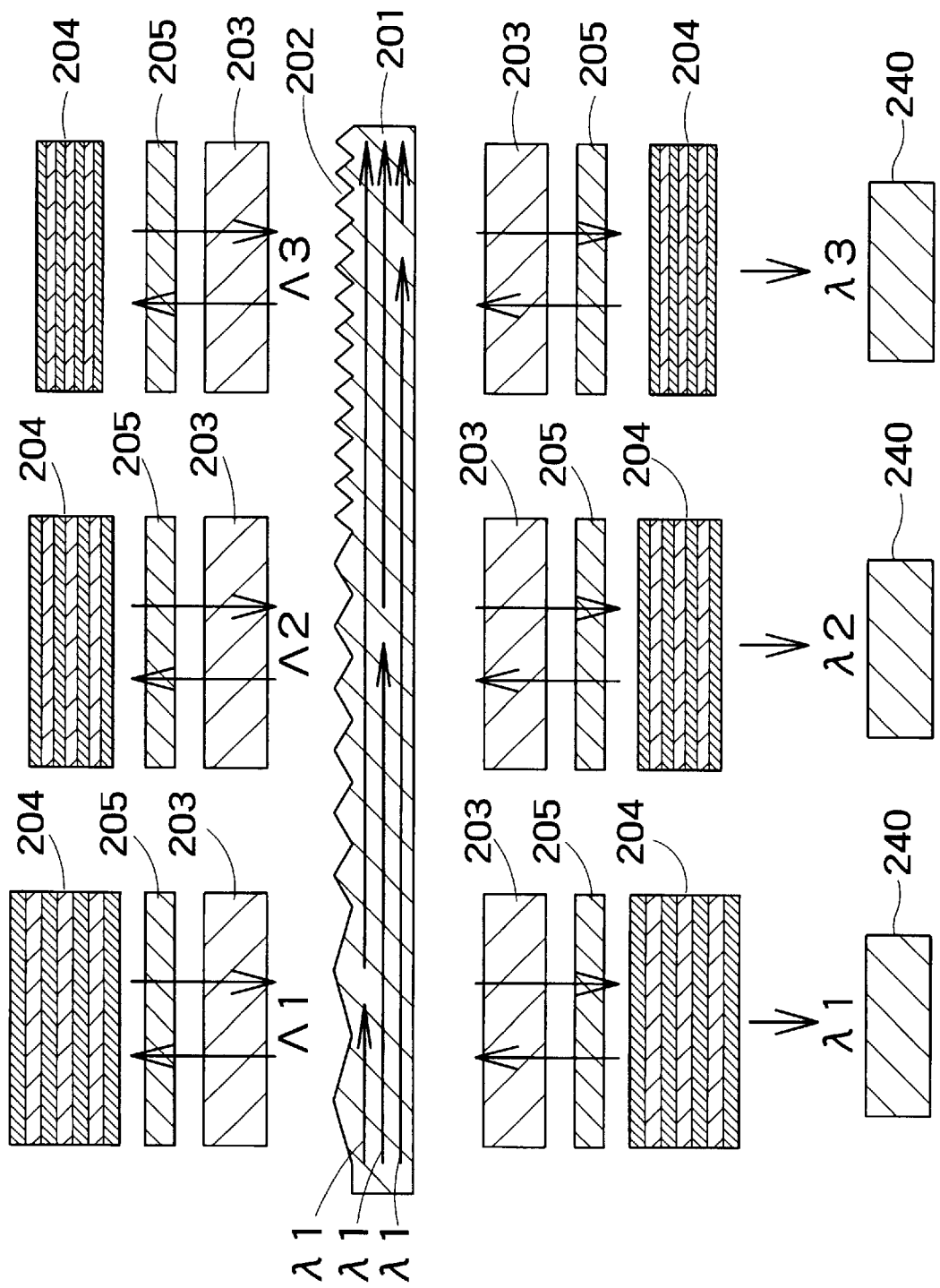
FIG. 22 is a conceptional diagram showing a ninth optical functional element according to the invention.

FIG. 22 is a conceptional diagram showing the ninth optical function element according to the invention. Here again, components or parts identical or equivalent to those of the embodiments explained with reference to FIGS. 15 through 21 are labeled with common reference numerals, and their detailed explanation is omitted. The construction of FIG. 22 is similar to that of the eighth optical functional element explained above. One of major differences lies in the way of application. That is, in the embodiment shown here, the waveguide 201 is a transmission line in which signals, particularly a plurality of signals different in wavelength, propagate. By using the construction as the eighth embodiment, the function of tuning the signals and separately amplifying and extracting them can be realized.

That is, the embodiment shown here corresponds to a tuner amplifier.

Concurrently, the transmission system in the embodiment shown here is also a ring network. That is, a signal introduced from the left end of the waveguide is output also from the right end, and detected also in another terminal. In this case, the amplifying function of radiation modes by the cavity structure also functions as a repeater and prevents attenuation of the signal.

Behaviors of the element according to the embodiment is based on the concept of the eight embodiment explained above. That is, radiation modes radiated vertically from diffraction gratings different in period are amplified by wavelength-selective cavities, and their outputs are detected. In FIG. 22, respective cavities are regarded as output ports, signals having different wavelengths are output downward on the drawing sheet from respective ports, and are received by detectors 240.

When the distance among wavelengths determined by the periods of the diffraction gratings (in the example of FIG. 22, the wavelength distance among Λ1, Λ2, Λ3) is large, they are radiated in directions offset from the vertical direction relative to the waveguide in portions of the gratings other than those with periods corresponding to these wavelengths. Therefore, tuning is realized merely by adjusting locations of the cavities. Tuning is possible also by modulating the refractive index of the waveguide.

If the wavelength deviation is narrow, then tuning can be made by modulating the phase control means 205 or by changing the refractive index of the DBR reflection means.

Next explained is the tenth optical functional element according to the invention.

Figure 23:
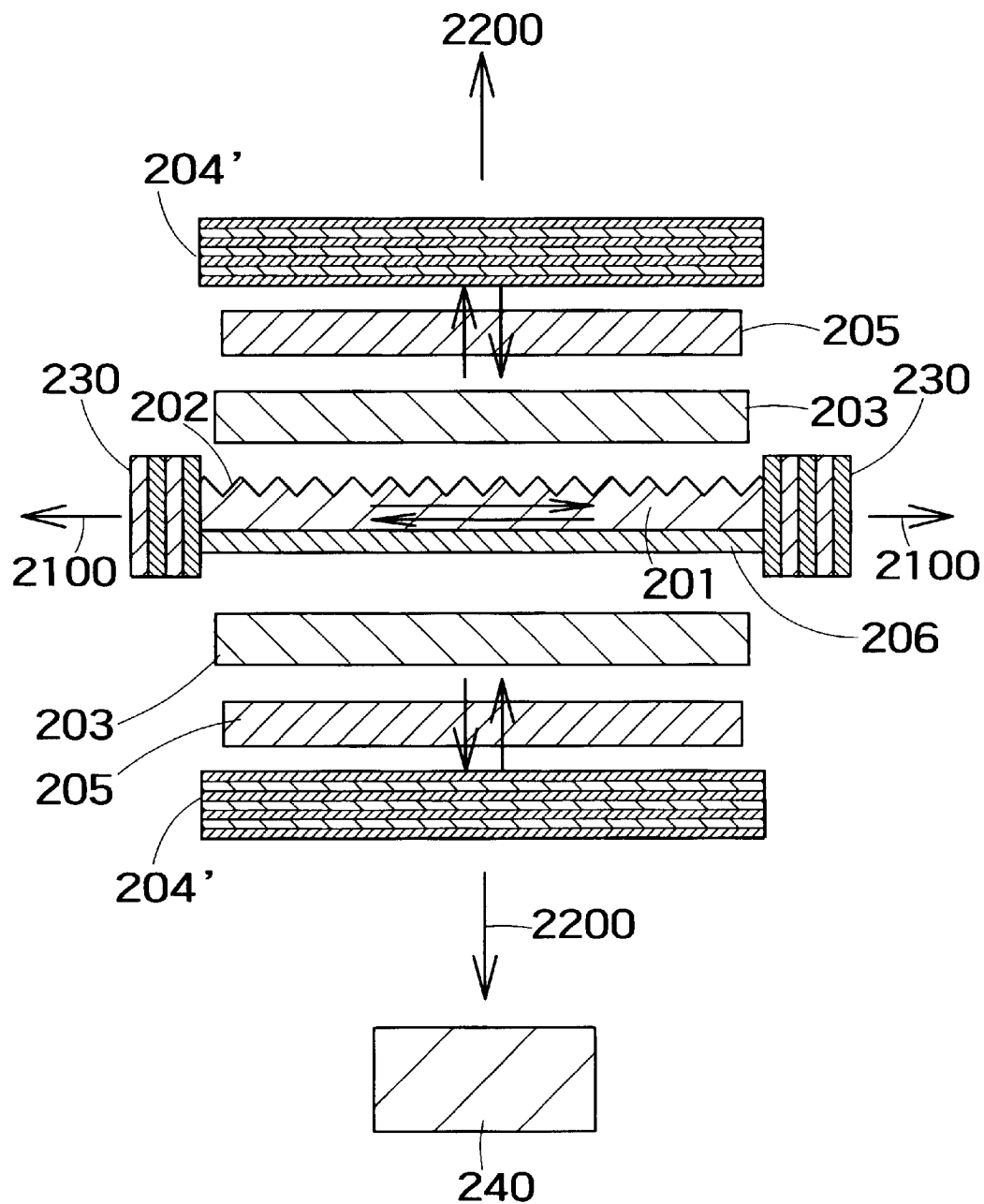
FIG. 23 is a conceptional digram showing a tenth optical functional element according to the invention.

FIG. 23 is a conceptional diagram showing the optical functional element according to the embodiment. Here again, components or parts identical or equivalent to those of the embodiments explained with reference to FIGS. 15 through 22 are labeled with common reference numerals, and their detailed explanation is omitted. The embodiment shown here is centralized to an optical functional element having the function of laser oscillation.

Remarkable features of the invention involve the use of a cavity for radiation modes in addition to the waveguide cavity normally used in wavelength lasers. Therefore, the present invention permits the variation which of them is used as the majority cavity or complementary cavity. Needless to say, there is also the combination for having both oscillate. There is also another variation where the output is extracted.

Although the waveguide structure 201 can bring about optical feed back only with the gratings, FIG. 23 shows an example having reflection structures 230 on both faces to reinforce the feedback.

In the case where the waveguide means is used as the major cavity like in the conventional laser, the cavity for radiation modes can be regarded as an optical pumping means for the main cavity.

Since the pumping means can be made closely along the waveguide 201, very efficient excitation is possible. In conventional semiconductor lasers configured to introduce electric current only into the waveguide, the current density into the narrow waveguide increases, and deterioration of the active layer 206 and local generation of heat are undesirable problems. In contrast, in the present invention, since injected electric current is dispersed toward the complementary cavity, adverse affection of heat is reduced, and the reliability can be improved. The invention has another new advantage that both current excitation and optical excitation are well balanced for the main cavity.

The embodiment may be configured either to extract optical output from a facet (output 2100) like conventional elements or to extract it as an amplified radiation mode from the radiation mode cavity in a form along the waveguide (output 2200). Any convenient one of these modes of output can be selected.

When the main cavity is the radiation mode cavity, the waveguide means 201 can be regarded as an optical pumping means. Similarly to the foregoing example, the embodiment may be configured either to extract optical output from a facet (output 2100) or to extract it as an amplified radiation mode from the radiation mode cavity in a form along the waveguide (output 2200). Any convenient one of these modes of output can be selected.

The embodiment shown here also has the receiver means 240 as a means commonly added to the invention. In this case, output light can be motivated through the receiver means 240 to control the laser output by using an external circuit, not shown. For example, APC (automatic power control) can be applied to maintain the laser output constant.

In the optically pumped waveguide means 201, media incapable of current excitation, particularly, media with a gain only under optical excitation, can be provided as a material. For example, it is a waveguide made of quarts doped with erbium (Er) or praseodymium (Pr). They are substantially the same as fiber amplifiers. A radiation mode cavity extending along the waveguide 201 has a powerful optical excitation effect for the waveguide amplifier. If excitation is the only target, reflectance to the radiation mode may be set to approximately 100% and output 2200 may be disregarded.

Selection of optical excitation or current excitation may be contrary to the foregoing example to use the radiation mode cavity.

Usually, however, the former example configured to excite along the long waveguide is more efficient. The use of a passive material incapable of flowing electric current to make the waveguide means 201 bring a large advantage from the viewpoint of its fabrication. That is, it is advantageous when the waveguide with an appropriate difference in refractive index is difficult to make by using semiconductors having a p-n junction. In this case, the waveguide may be made of a material other than semiconductors. This is a structure having, for example, quartz ($SiO_2$) clad and SiN core.

Figure 24A:
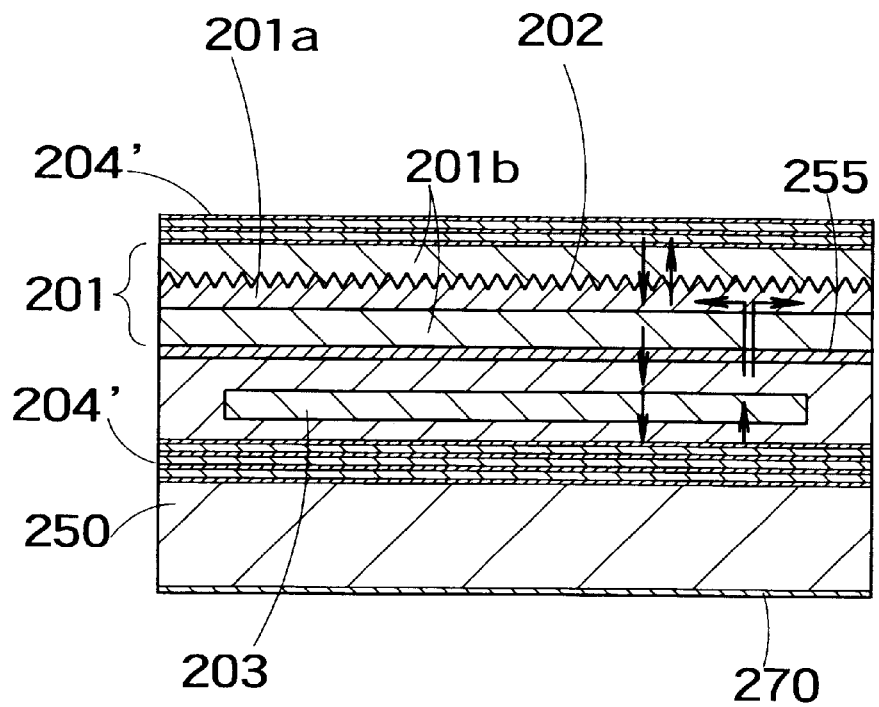
Figure 24B:
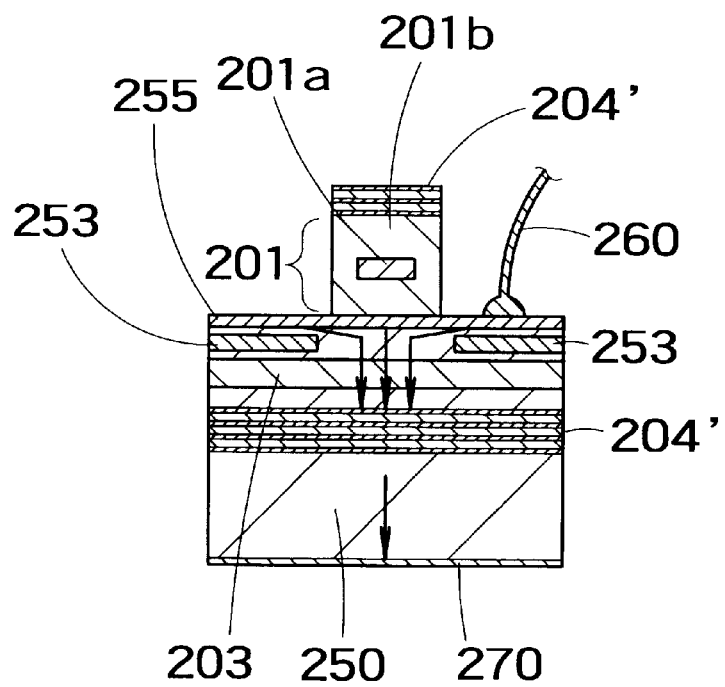

FIGS. 24A and 24B are conceptional diagrams showing cross-sectional configurations of an element employing quartz clad. That is, FIG. 24A is a cross-sectional view taken along the center axis of the waveguide, and FIG. 24B is a cross-sectional view taken along a plane vertical to the waveguide.

Its fabrication is explained below, following its manufacturing step. First grown on a semiconductor substrate 250 are a DBR reflector 204' and an active layer 203 having a gain at the p-n junction. Troublesome crystal growth is required only in this process, and the number of growth steps can be reduced. Used as the electrode is a transparent electrode 255 of ITO (indium tin oxide), for example. Formed thereon is a waveguide structure 201 made of quarts ($SiO_2$) clad 201*b* and a SiN core 201*a*. Second-order diffraction gratings 202 are made in the SiN wavelength core 201*a*. Further formed on the waveguide structure 201 is a dielectric high-reflectivity multi-layered film 204' made of $SiO_2$ and Si (silicon). On the bottom surface of the substrate 250, an electrode 270 is formed. A wire 260 is bonded to the transparent electrode 255. Electric current introduced through the transparent electrode 255 is focused into the active layer 203 below the waveguide structure 201 as shown by arrows in FIG. 24B by the current blocking region 253.

The construction shown in FIGS. 24A and 24B can be fabricated easily because the electrically conducting region and the waveguide region can be separated by absolutely different materials. For example, the waveguide region may be combination of $SiO_2$ clad and SiN core explained above, or may be an optical fiber having formed diffraction gratings. Alternatively, diffraction gratings may be made in the transparent electrode of ITO, for example, and the clad of $SiO_2$ or other material may be stacked.

In this manner, when the waveguide region is made of a material different from that of the electrically conducting region, the step of making the waveguide portion can be executed again without damaging the expensive semiconductor growth wafer even upon a failure in fabrication of the waveguide portion. The embodiment has another advantage that, since the waveguide can be made to have a smaller refractive index than semiconductors and may be as large as approximately twice in size, its processing is easy.

Moreover, since changes with temperature of refractive indices of the diffraction gratings 202 and the waveguide portion 201 determining the oscillation wavelength are small than those of semiconductor materials, a laser stable in wavelength against temperature can be realized. This is suitable for use as a light source for WDM (wavelength division multiplexing) in optical transmission. Furthermore, since the waveguide portion 201 is similar to a quartz fiber, coupling to fibers is established easily.

As explained above, no processing of semiconductors is required on the waveguide in the gain region. Since the embodiment does not require an exudation region for optical modes outside the stripe of the active layer, the semiconductor portion can be manufactured much more easily.

On the other hand, a large effect can be obtained also when the waveguide is mad of a passive semiconductor material. When the waveguide is passive, the waveguide itself is free from affection of the carrier density. Therefore, the phenomenon of "holeburning" is prevented, in which spatial non-uniformity of the carrier density causes non-uniformity of the refractive index and hence fluctuates the transverse mode and the longitudinal mode. As a result, modes are stable even upon a high output, and a bending called "kink" does not occur in the current-optical output characteristics.

There is another method for activating the waveguide 201 with a reverse bias.

Figure 25A:
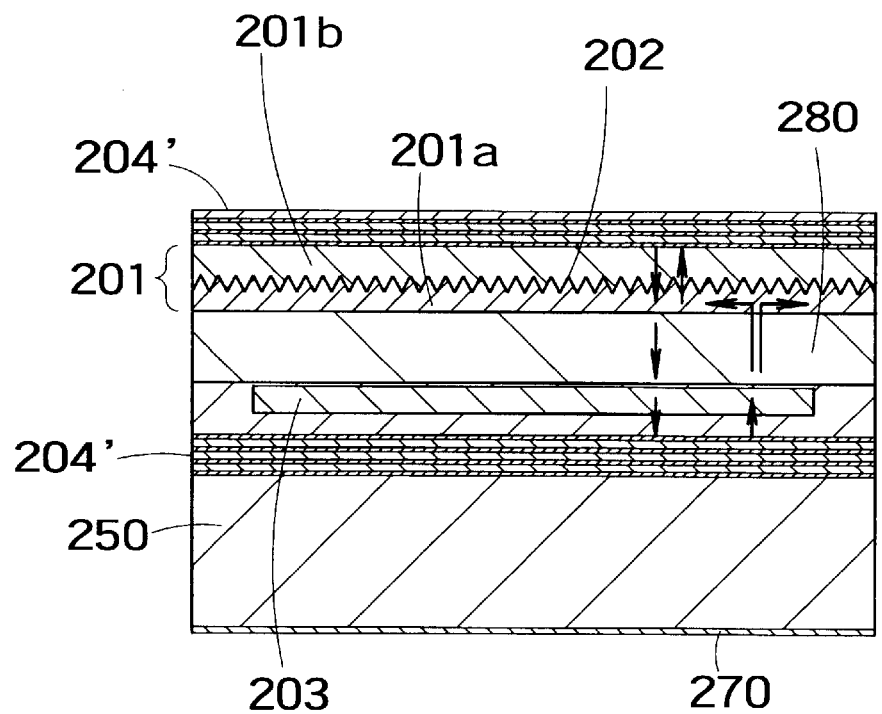
Figure 25B:
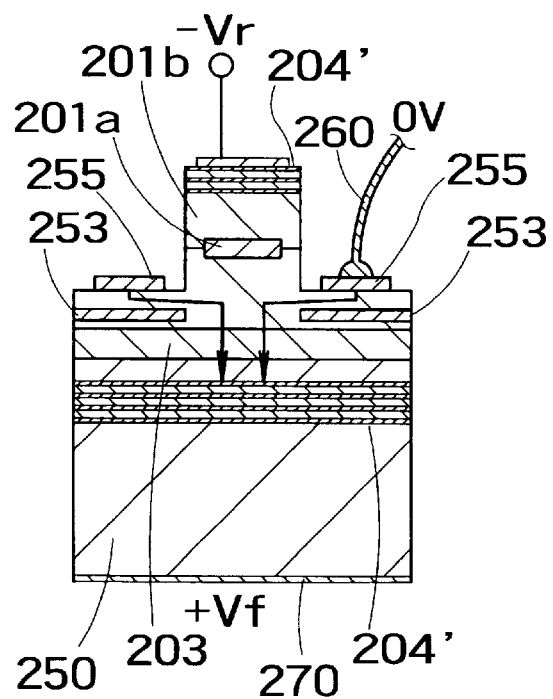

FIGS. 25A and 25B are conceptional diagrams showing cross-sectional configurations of an element in which the waveguide is activated by a reverse bias. That is, FIG. 25A is a cross-sectional view taken along the center axis of the waveguide, and FIG. 25B is a cross-sectional view taken along a plane vertical to the waveguide. In these drawings, component of parts identical or equivalent to those of the specific examples explained with reference to FIGS. 15 through 24B are labeled with common reference numerals, and their detailed explanation is omitted.

In the element shown here, the layer between the waveguide structure 201 and the gain region 203 is a ground of n-type InP 280, and its upper and lower layers are p-type layers. When the waveguide portion 201*a* (core) is made of a material with a crystalline composition in which the real number portion of the refractive index changes in an electric field, the oscillation wavelength can be adjusted by the electric field. That is, a tunable laser having a wide tunable range can be realized.

Alternatively, if the waveguide portion 201*a* (core) is made of a material with a crystalline composition in which the imaginary number portion of the refractive index changes in an electric field, the loss changes with electric field. This is the same function as that of an electro-absorption modulator. Such changes with electric field can be used for modulation of output light. In this case, unlike direct modulation by an electric current, it is modulation of the optical loss by an electric field. As compared with modulation of the forward-injected carrier density, the example shown here can obtain a smooth output waveform less affected by relaxation vibration under a high speed. This corresponds to obtaining a so-called "eye-opened state" when observing the output waveform, and high-speed optical transmission with a very low bit error rate is ensured.

Additionally, the laser and the modulator can be integrated.

Figure 26A:
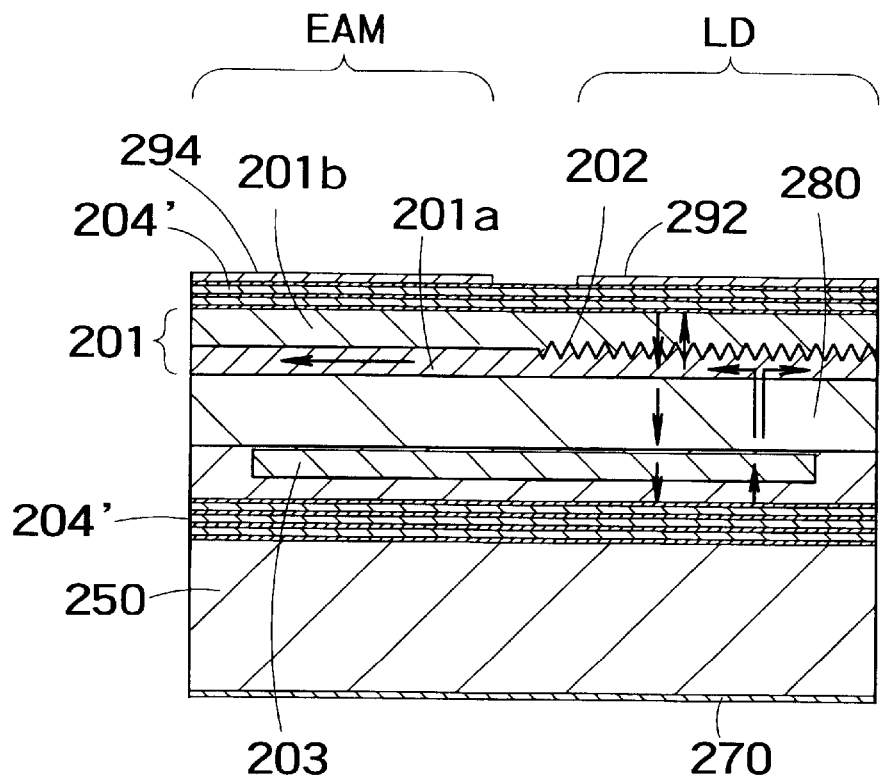
Figure 26B:
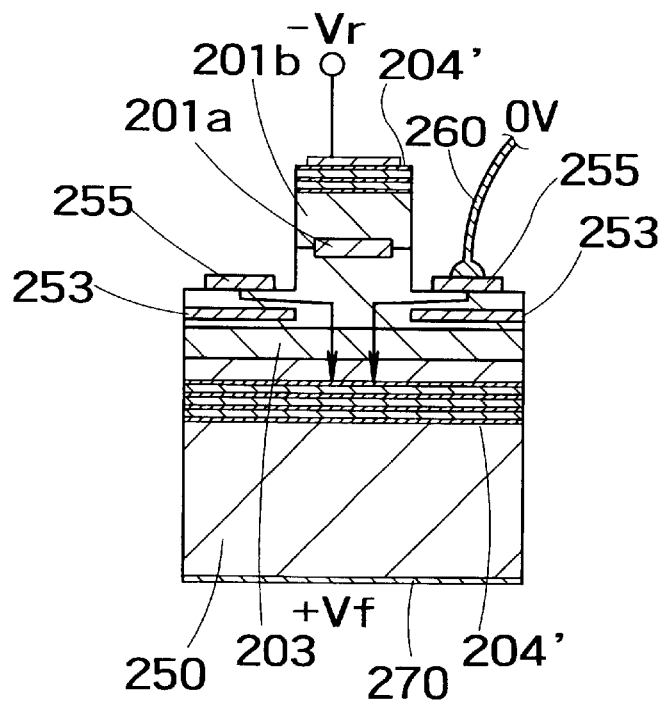

FIGS. 26A and 26B are conceptional diagrams showing cross-sectional configurations of an optical functional element incorporating a laser (LD) and an optical modulator (EAM). That is, FIG. 26A is a cross-sectional view taken along the longitudinal center axis of its waveguide, and FIG. 26B is a cross-sectional view taken along a transversal plane vertical to the waveguide. In a so-called direct modulation system in which the current to be introduced into the laser is changed, chirp also occurs due to changes in refractive index. In contrast, in the specific example shown here, by separately integrating EAM which is an electro-absorption modulator higher-speed, more stable optical transmission is ensured.

That is, the core portion 201*a* of the waveguide 201 has a crystalline composition in which the imaginary number portion of the refractive index changes in an electric field. For example, InGaAsp is used. Then, optical loss changed by application of an electric field. This is the same function as that of an electro-absorption modulator. Such changes with electric field can be used for optical modulation.

In addition to the major structural portion LD of the present invention behaving as a laser, the extend portion of the waveguide with diffraction gratings (in this position, diffraction gratings are removed to prevent laser function) is used as an electro-absorption modulator (EAM). LD has formed in electrode 292 whereas EAM has formed an electrode 294.

In the element shown here, the structure from the gain region 203 to the waveguide 201a can be made in a single process of crystal growth. Since the waveguide in the present invention is apart from the gain region 203 and DBR 204' and can prevent affection to guided mode propagation, they can be grown in a single step. In the EAM portion, no electric current is injected to the gain region 203 not to excite it. When the gain region 203 is not excited, the absorption ratio increases. However, in the present invention, separately providing the waveguide 201, light can be propagated and modulated through the waveguide 201.

The waveguide portion of the gain region having diffraction gratings may be a tunable laser within the extent not increasing absorption so much.

Unlike direct modulation of the laser by an electric current, EAM is modulation of optical loss by an electric field, As compared with modulation of the forward-injected carrier density, the example shown here has the merit that a smooth output waveform less affected by relaxation oscillation can be obtained under a high speed.

Next explained is the eleventh optical functional element according to the invention.

Figure 27:
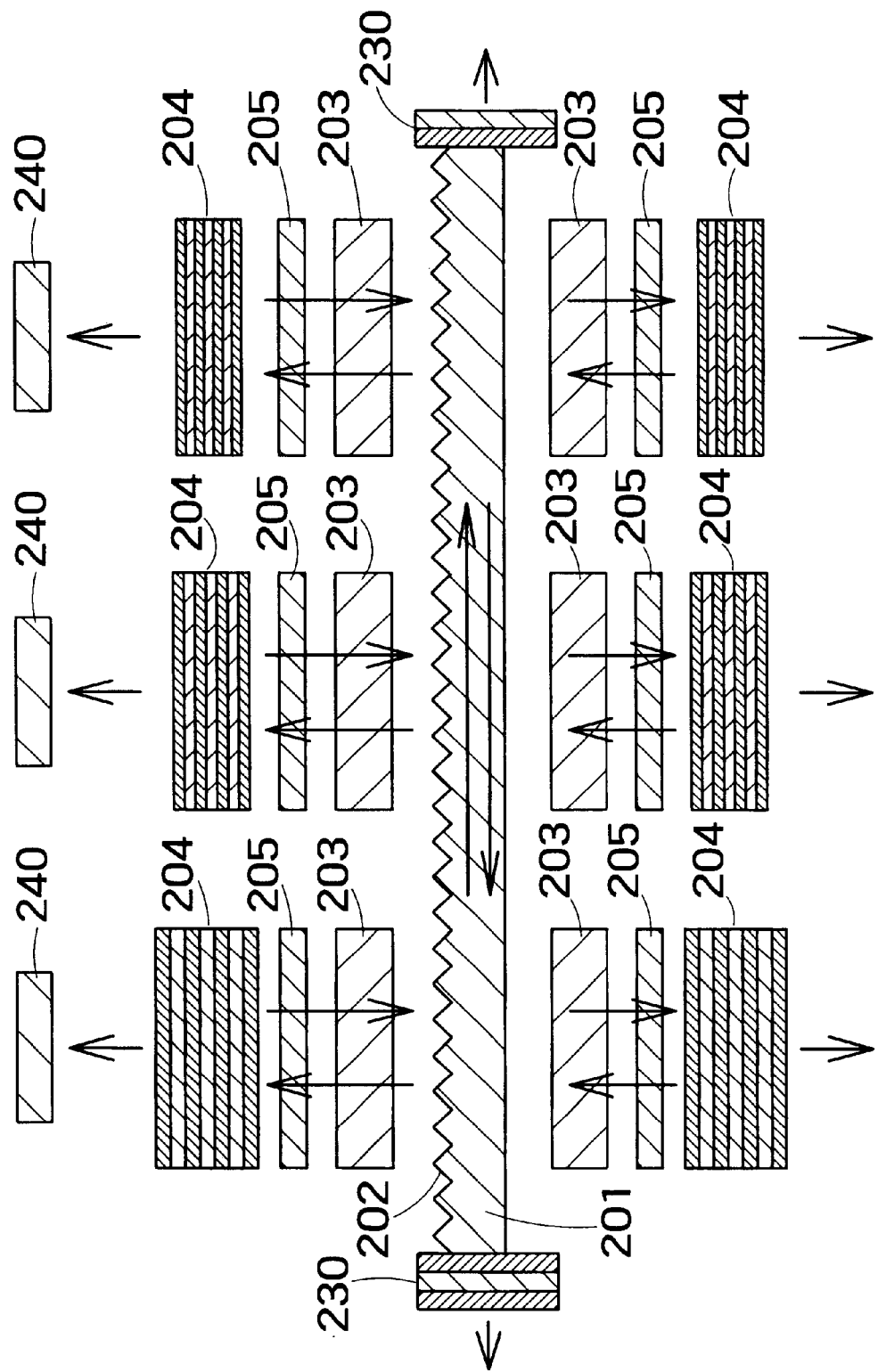
FIG. 27 is a conceptional diagram showing an eleventh optical functional element according to the invention.

FIG. 27 is a conceptional diagram showing the optical active device according to the embodiment. Here again, components or part identical or equivalent to those of the embodiments explained with reference to FIGS. 15 to 26B are labeled with common reference numerals, and their detailed explanation is omitted. In the embodiment shown here, a plurality of radiation mode cavities are provided along the long wavelength 201, and are modulated independently of each other. This construction makes it possible to vary pumping of the waveguide 201 in the axial direction of the waveguide when the waveguide 201 is the main oscillator. This also enables tuning of the oscillation wavelength. Moreover, optical intensity along the waveguide axial direction becomes uniform, and oscillation instability by non-uniformity, such as spatial holeburning, can be compensated.

In the case where a plurality of radiation mode cavities are used as major oscillators, they can be modulated independently. Moreover, they may be controlled to be different in oscillation wavelength from each other for application as a light source of wavelength division multiplexing (WDM) to output to the wavelength 201.

While the tuner amplifier shown in FIG. 22 is an optical functional element for dividing and receiving optical signals, the embodiment shown here can be configured as an optical functional element for multiplexing optical signals and transmitting them to the waveguide, in which the radiation mode cavities are used as wavelength multiplexing laser oscillators. Since the transmitter according to the embodiment is similar in construction to the receiver of FIG. 22, the embodiment is excellent also from the viewpoint of productivity.

Next explained is the twelfth optical functional element according to the invention.

Figure 28:
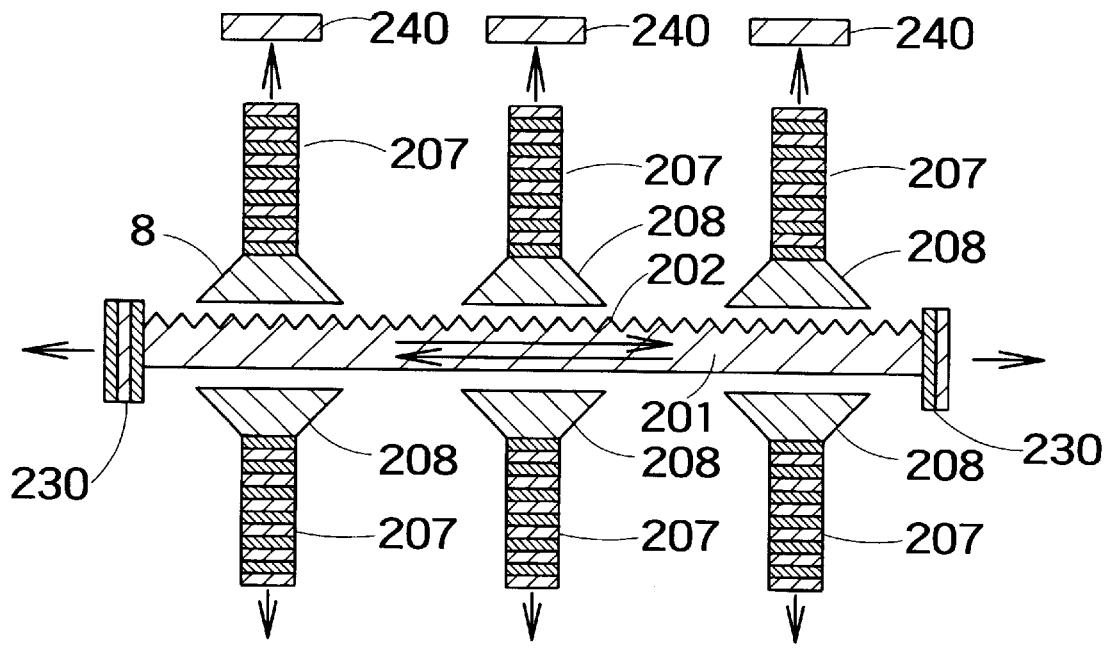
FIG. 28 is a conceptional diagram showing a twelfth optical functional element according to the invention.

FIG. 28 is a conceptional diagram showing the optical functional element according to the embodiment. Here again, components or parts identical or equivalent to those of the embodiments explained with reference to FIGS. 15 through 27 are labeled with common reference numerals, and their detailed explanation is omitted. The embodiment shown here is a modified version of the radiation mode cavity which also has a waveguide function. That is, the optical functional element shown in FIG. 28 is an example in which a cavity for amplifying radiation modes is realized in form of a waveguide gain DBR structure 207. The "gain (active) DBR" here means a distributed Bragg reflector having a gain and a wavelength selectivity. In the embodiment shown here, the amplifier means, reflection means and phase control means are unified into the gain DBR waveguide 207.

This has a structure partly similar to a normal DFB laser. That is, it has diffraction gratings in the waveguide, has an active layer, and has an amplifying function if a gain is obtained by supplying an electric current. If the refractive index is changed by a reverse bias electric field, then a phase control function is obtained. Needless to say, it also has a reflecting function for reflecting back an input with its diffraction gratings.

Furthermore, it is formed to guide radiation modes into the DBR waveguide 207 via a taper region 208 for receiving radiation modes. Direction of the DBR waveguide 207 is vertical to the wavelengths 201, taking directions of radiation modes into consideration.

Next explained is the thirteenth optical functional element according to the invention.

Figure 29:
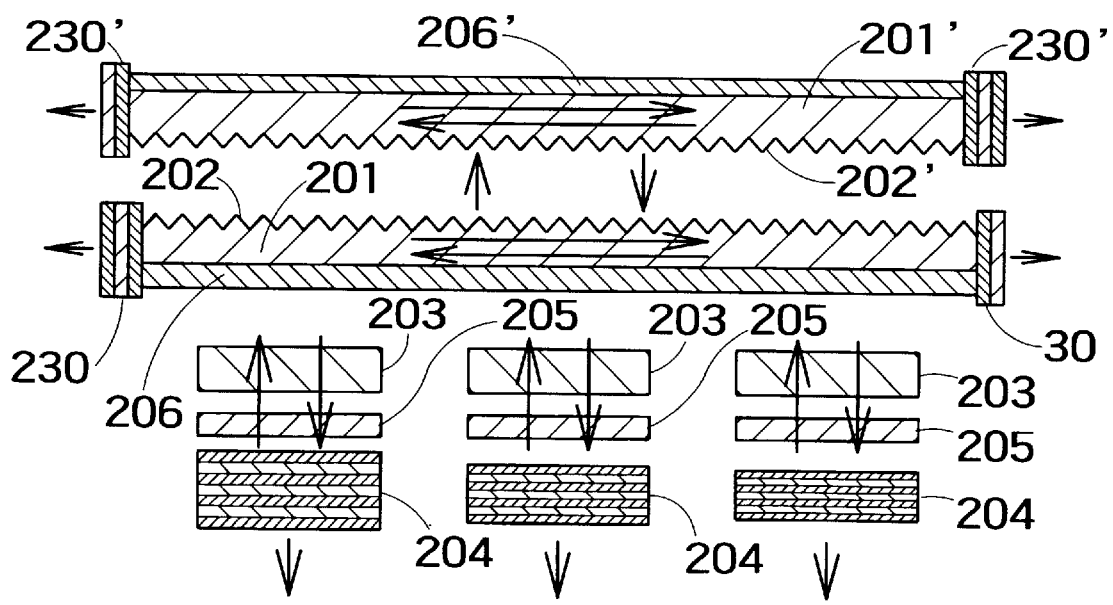
FIG. 29 is a conceptional diagram showing a thirteenth optical functional element according to the invention.

FIG. 29 is a conceptional diagram showing the optical functional element according to the embodiment. Here again, components or parts identical or equivalent to those of the embodiments explained with reference to FIGS. 15 through 28 are labeled with common reference numerals, and their detailed explanation is omitted. The embodiments shown here is related to the element shown in FIG. 28. That is, the upper side of the cavity for amplifying radiation modes is formed as a waveguide 201' parallel to the original waveguide 201. The waveguide 201' has formed an active region 206' and functions to obtain a gain, that is, has the amplifying function. Reflection films 230' are formed on facets. Coupling of radiation modes to the waveguide 201' is established by second-order diffraction gratings 202 and similar diffractive gratings 202' formed in the waveguide 201. From another point of view, the embodiment shown here is regarded as having a plurality of structures of the waveguide 201 which are coupled to each other by their diffraction gratings.

Therefore, as a modified version of this embodiment, a cavity, not shown, which extends vertically, may be further provided above the cavity 201'.

Next explained is the fourteenth optical functional element according to the invention.

Figure 30:
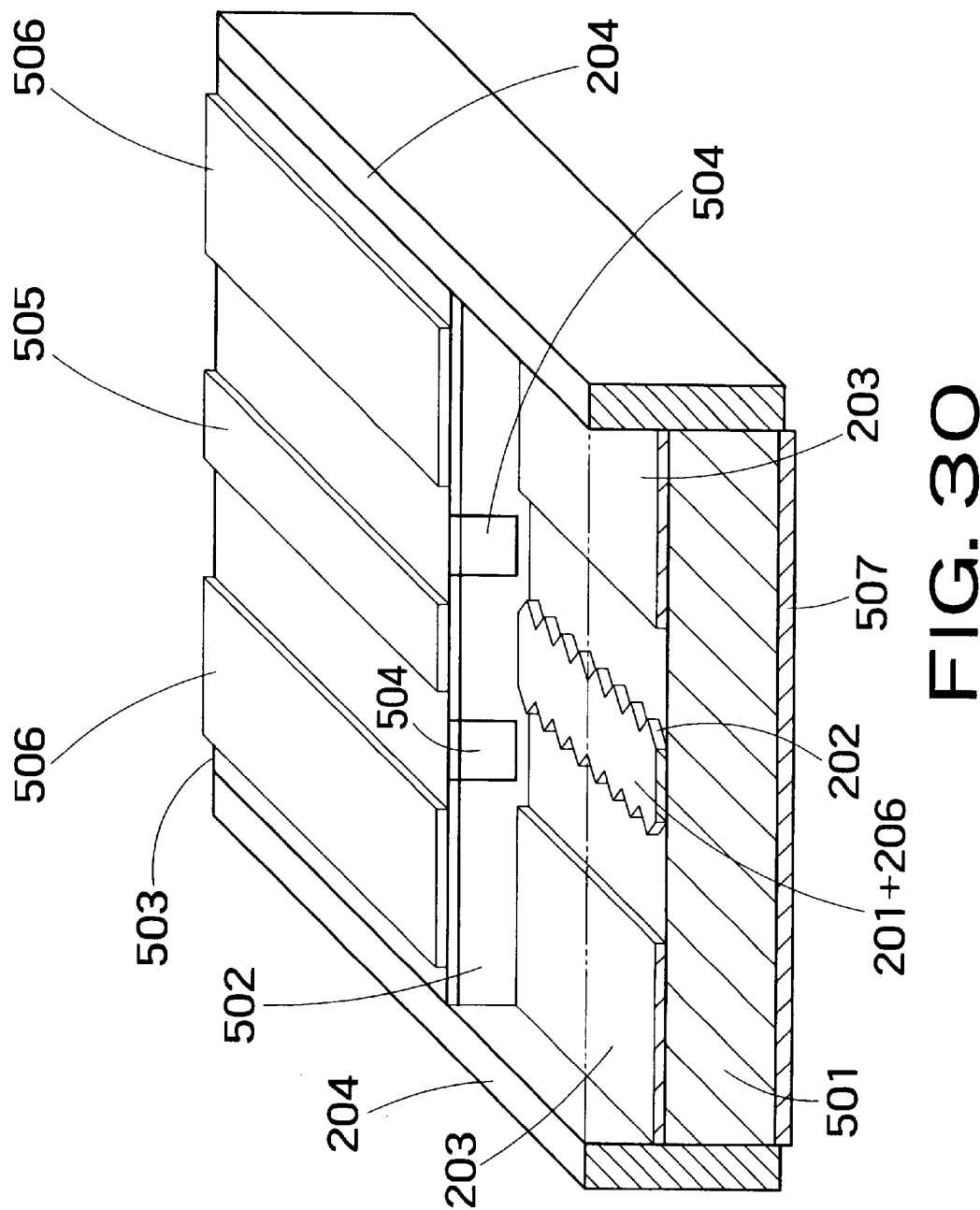
FIG. 30 is a partly cut out, perspective view showing a fourteenth optical functional element according to the invention.

FIG. 30 is a partly cut-out, perspective view of the optical functional element according to the embodiment. Here again, components or parts identical or equivalent to those of the embodiment explained with reference to FIGS. 15 through 29 are labeled with common reference numerals, and their detailed explanation is omitted.

The optical functional element according to the instant embodiment has the construction explained below, following its manufacturing process.

First stacked on the same n-type InP substrate 501 is an InP buffer layer (not shown) of the same n-type. Thereafter, an waveguide layer with gain (201+206) made of InGaAsP is grown. By patterning it, second-order diffraction gratings 202 are formed on its side surfaces.

At the time, gain regions 203 are also formed as the remainder portions.

Grown thereon are a p-type InP cladding layer 502 and a p-type InGaAsP contact layer 503. After that, in order to excite the waveguide with gain (201+206) and the gain regions 203 independently, a proton bombarded region 504 for isolation is made. Further formed are the p-side electrode for the waveguide and the p-side electrode 506 for the amplifier, and the n-side electrode 507 is formed on the bottom surface of the substrate. Finally, the high-reflectivity film 204 is stacked on cleaved facets outside the gain regions 203.

In this manner, construction of the present invention can be integrated monolithically on the InP substrate. In the example shown here, respective functions are integrated in a direction horizontal to the substrate surface. Although the illustration example is a simple basic element, a plurality of elements can be integrated in arrays.

Next explained is a fifteenth optical functional element according to the invention.

Figure 31:
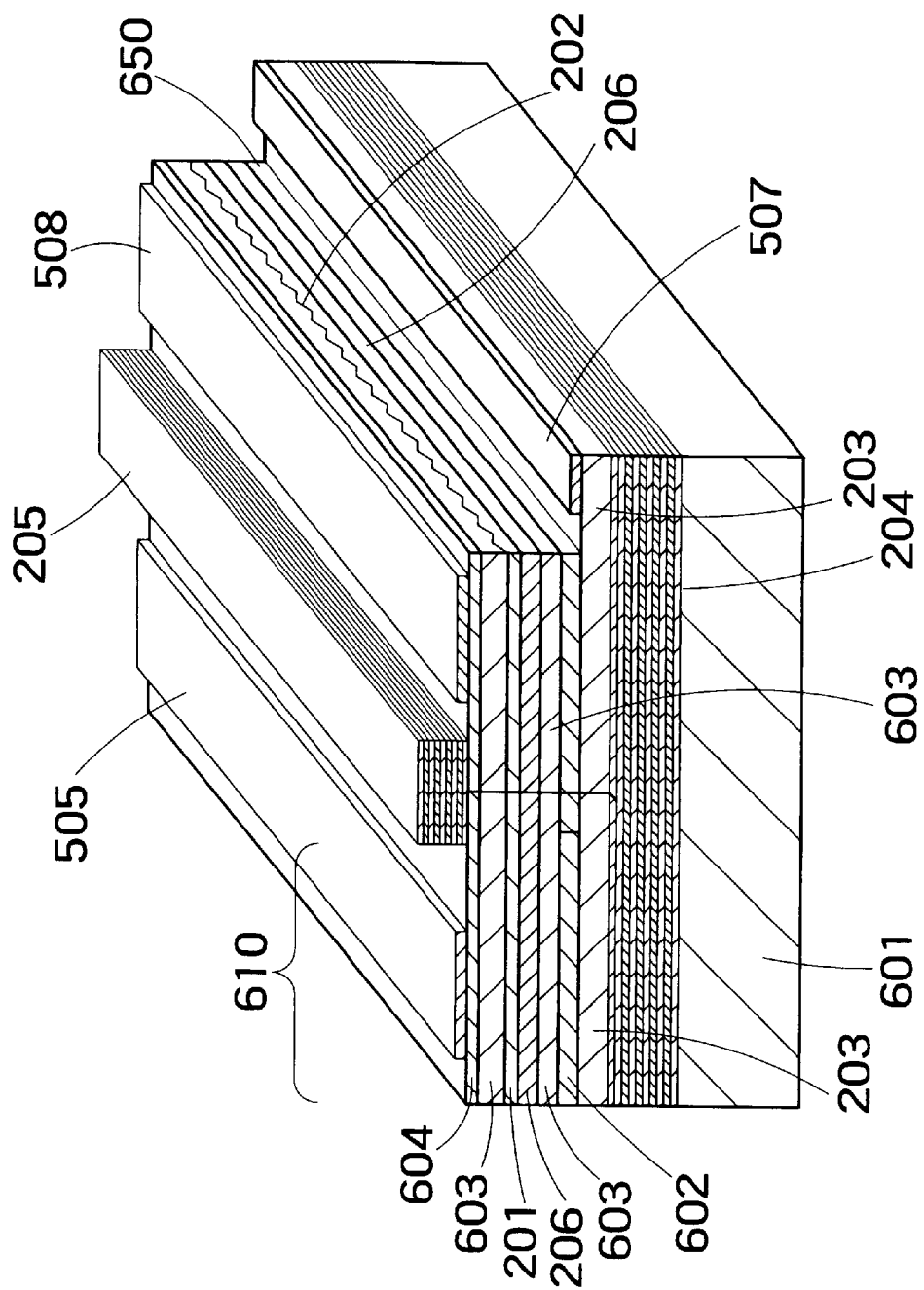
FIG. 31 is a schematic, perspective view showing a fifteenth optical functional element according to the invention.

FIG. 31 is a perspective view schematically showing the optical functional element according to the embodiment. Here again, components or parts identical or equivalent to those of the embodiments explained with reference to FIGS. 15 through 30 are labeled with common references numerals, and their detailed explanation is omitted. The example shown in FIG. 31 is a version using GaAlAs/GaAs materials, and its construction is explained below, following its manufacturing process.

First grown on a semi-insulating GaAs substrate 601 is a lower side high-reflectivity multi-layered film 204. The multi-layered film 204 may be made by stacking an AlAs layer and a GaAs layer. As to the multi-layered film 204 grown in this manner, reflectance of the AlAs layer can be further increased later by adding an Al oxide by selective oxidation.

Next grown thereon are a GaAs amplifying layer 203 having a gain, n-type AlAs layer 602, and GaAlAs (mole fraction of Al:0.3) cladding layer 603. After the active layer 206 is grown subsequently, a GaAlAs (mole fraction of Al:0.15) waveguide layer 201 is grown.

After the product is once removed from the growth furnace, second-order diffraction gratings 202 are made. After that, a GaAlAs cladding layer 603 is grown by another crystal growth process.

Continuously to it, a GaAs contact layer 604 is grown.

Its p-n junction is made by a diffusion region 610 in which Zn (zinc) is diffused. This is a so-called transverse junction stripe (TJS) structure. For both the layer structure of the amplifier means 203 and the layer structure of the active layer 206 which are stacked and integrated, the p-n junction can be made simultaneously. The TJS structure is characterized in that light is confined near the junction and is guided along it. Further, a dielectric multi-layered film is formed on the upper side as a high-reflectivity film 205.

In this manner, an integrated element stacking respective means vertically of the substrate surface is obtained. Additionally, by changing a part of the AlAs layer 602 into an Al oxide film 650 by selective oxidation from a lateral direction by using water vapor, it is possible to configure the active layer 206 and the gain layer 203 to perform insulating function and current blocking function.

By further making the p-side electrode 505, n-side electrode (for the waveguide) 507 and n-side electrode (for the amplifying layer) 508, the optical functional element is completed.

The optical functional element according to the instant embodiment is a surface-type vertical-integrated device. This is applicable also to an array of a plurality of elements, similarly to the optical functional element shown in FIG. 30.

Next explained is an optical transmission device according to the invention.

Figure 32:
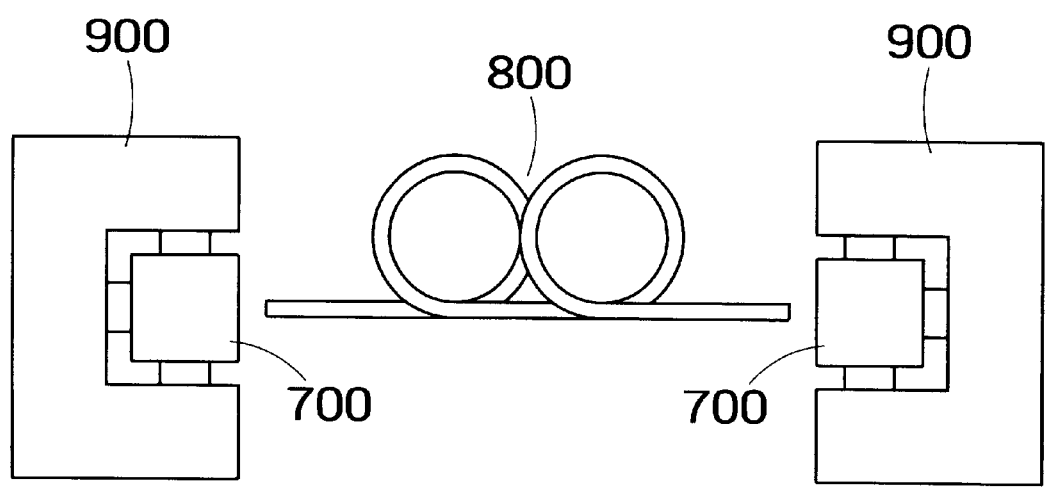
FIG. 32 is a conceptional diagram showing an optical transmission device according to the invention.

FIG. 32 is a conceptional diagram showing the optical transmission device according to the invention. the optical transmission device shown here is an application of any one of DFB lasers shown in FIGS. 1 through 5, optical isolators shown in FIGS. 7A through 13 or optical functional elements shown in FIGS. 15 through 31. Connected around an optical transmission/receiving portion 700 is an electronic circuit portion including a drive circuit of LD (laser diode), circuit for measuring optical current from PD (photo diode), APC circuit, and signal generator, for example. An optical signal generated in the optical functional element is transferred through the optical fiber 800. It may be transferred by space transmission not using fibers.

According to the invention, since various functions are integrated, the transmission/receiving device can be small-scaled remarkably. Additionally, since assembly of the transmission/receiving device in its manufacturing process is simplified, the cost is reduced significantly. Furthermore, it is easy to connect to optical fibers. Since the waveguide less variable with temperature can be separated from the gain region with large changes with temperature, the wavelength stability can be maintained.

The invention has been explained above by way of embodiments with reference to specific examples. However, the invention is not limited to these examples.

For example, the above-introduced examples have been explained as using InGaAsP/InP or GaAlAs/GaAs materials. However, the invention is similarly applicable to elements using other various materials.

Such materials involve III-V compound semiconductors such as InGaAlP and BInGaAlN, II-IV compound semiconductors such as ZnSe and ZeS, and group IV semiconductors such as SiC.

Moreover, also regarding constructions of the waveguide means, amplifying means, reflection means and phase control means, for example, used in the invention, other constructions appropriately selected by the skilled in the art can be used to obtain the same or similar effect as those of the introduced examples.

Furthermore, also regarding the numbers of these means and positional relations between them, the skilled in the art can appropriately determine them and will obtain the same effects.

That is, the invention can be extended to various applications within the extent not departing from its concept.

While the present invention has been disclosed in terms of the preferred embodiment in order to facilitate better understanding thereof, it should be appreciated that the invention can be embodied in various ways without departing from the principal of the invention.

Therefore, the invention should be understood to include all possible embodiments and modification to the shown embodiments which can be embodied without departing from the principle of the invention as set forth in the appended claims.

What is claimed is:

1. A distributed feedback laser comprising:
    waveguide means having a hologram capable of emitting radiation mode light in upper and lower directions;
    first reflection means provided below said waveguide means for returning said radiation light back to said waveguide means; and
    second reflection means provided above said waveguide means for returning said radiation mode light back to said waveguide mean;
    wherein said hologram has at least one discontinuous region in its periodic structure.

2. The distributed feedback laser according to claim 1, wherein said discontinuous region is a phase shift having a period of one quarter of the wavelength.

3. The distributed feedback laser according to claim 2 wherein said phase shift is a diffraction grating.

* * * * *